US012648272B2

(12) United States Patent
Lim et al.

(10) Patent No.: US 12,648,272 B2
(45) Date of Patent: Jun. 2, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Sanghyung Lim, Yongin-si (KR); Mihyang Sheen, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 908 days.

(21) Appl. No.: 17/853,017

(22) Filed: Jun. 29, 2022

(65) Prior Publication Data

US 2023/0068019 A1 Mar. 2, 2023

(30) Foreign Application Priority Data

Aug. 24, 2021 (KR) ........................ 10-2021-0111872

(51) Int. Cl.
*H10H 20/851* (2025.01)
*H10H 20/01* (2025.01)
(Continued)

(52) U.S. Cl.
CPC ........ *H10H 20/8514* (2025.01); *H10H 20/01* (2025.01); *H10H 20/8312* (2025.01); *H10H 20/857* (2025.01); *H10H 20/032* (2025.01); *H10H 20/0361* (2025.01); *H10H 20/0364* (2025.01)

(58) Field of Classification Search
CPC .............. H10H 20/8514; H10H 20/01; H10H 20/8312; H10H 20/857; H10H 20/032;

H10H 20/0361; H10H 20/0364; H10K 71/80; H10K 2102/331; H10K 59/124; H10K 59/38; H10K 59/127; H10K 50/125;
(Continued)

(56) References Cited

U.S. PATENT DOCUMENTS 7,339,315 B2 3/2008 Suh et al.
10,312,228 B2 6/2019 Chen et al.
(Continued)

FOREIGN PATENT DOCUMENTS

CN 109873085 A 6/2019
CN 109638055 B 4/2021
(Continued)

OTHER PUBLICATIONS

Extended European Search Report for EP Patent Application No. 22191868.3 dated Jan. 27, 2023; 8 pages.
(Continued)

*Primary Examiner* — Herve-Louis Y Assouman
(74) *Attorney, Agent, or Firm* — CANTOR COLBURN LLP

(57) ABSTRACT

A display apparatus includes: an overcoat layer; a first color filter layer, a second color filter layer, and a third color filter layer arranged on the overcoat layer; a first planarization layer arranged on the first color filter layer, the second color filter layer, and the third color filter layer; a second planarization layer arranged on the first planarization layer and defining a first through-hole, a second through-hole, and a third through-hole therein; a first quantum dot layer in the first through-hole; and a second quantum dot layer in the second through-hole.

15 Claims, 34 Drawing Sheets

(51) Int. Cl.

| | |
|---|---|
| *H10H 20/831* | (2025.01) |
| *H10H 20/857* | (2025.01) |
| *H10K 50/84* | (2023.01) |
| *H10K 59/12* | (2023.01) |
| *H10K 59/123* | (2023.01) |
| *H10K 59/124* | (2023.01) |
| *H10K 59/127* | (2023.01) |
| *H10K 59/38* | (2023.01) |
| *H10K 71/00* | (2023.01) |
| *H10K 71/80* | (2023.01) |
| *H10K 102/00* | (2023.01) |

(58) Field of Classification Search
CPC .. H10K 50/84; H10K 59/1201; H10K 59/123; H10K 71/00; G02B 5/201
See application file for complete search history.

(56) References Cited

U.S. PATENT DOCUMENTS

| | | | |
|---|---|---|---|
| 10,373,978 | B2 | 8/2019 | Lee et al. |
| 10,747,047 | B2 | 8/2020 | Lee et al. |
| 11,228,012 | B2 | 1/2022 | Lee et al. |
| 11,703,711 | B2 | 7/2023 | Kim et al. |
| 2019/0377223 | A1* | 12/2019 | Lee ................... G02F 1/133514 |

FOREIGN PATENT DOCUMENTS

| | | | |
|---|---|---|---|
| EP | 3355357 | A1 | 8/2018 |
| EP | 3629377 | A1 | 4/2020 |
| EP | 3792978 | | 3/2021 |
| KR | 100401378 | B1 | 10/2003 |
| KR | 1020050029426 | A | 3/2005 |
| KR | 20150066792 | A | 6/2015 |
| KR | 1020150078331 | A | 7/2015 |
| KR | 1020180087823 | A | 8/2018 |
| KR | 1020180087908 | A | 8/2018 |
| KR | 20190061744 | A | 6/2019 |
| KR | 102015126 | B1 | 8/2019 |
| KR | 1020190140125 | A | 12/2019 |
| KR | 20200036235 | A | 4/2020 |

OTHER PUBLICATIONS

European Office Action, Application No. 22191868.3, mailed Aug. 7, 2025; 4 pages.

* cited by examiner

FIG. 6

DISPLAY APPARATUS AND METHOD OF MANUFACTURING THE SAME

This application claims priority to Korean Patent Application No. 10-2021-0111872, filed on Aug. 24, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the same.

2. Description of the Related Art

A display apparatus may include a plurality of pixels. For a full-color display apparatus, each of the plurality of pixels may emit light of a different color. To this end, at least some pixels of the display apparatus may include a color conversion unit. Accordingly, the light generated by a light-emitting unit of some pixels may be converted into light of a different color while passing through the color conversion unit to be extracted to the outside.

SUMMARY

However, in the conventional display apparatus, misalignment may occur in a process of bonding a light-emitting unit on which a transistor and a light-emitting element are arranged and a color conversion unit on which a color conversion material is arranged, thereby reducing light efficiency.

One or more embodiments include a display apparatus capable of preventing or minimizing misalignment caused in a process of bonding a light-emitting unit and a color conversion unit to each other, and at the same time improving light efficiency of the display apparatus by forming a color filter layer and a quantum dot layer on a substrate on which a transistor is arranged, and a method of manufacturing the display apparatus.

Additional aspects will be set forth in part in the description which follows and, in part, will be apparent from the description, or may be learned by practice of the presented embodiments of the disclosure.

According to one or more embodiments, a display apparatus includes: an overcoat layer; a first color filter layer, a second color filter layer, and a third color filter layer arranged on the overcoat layer; a first planarization layer arranged on the first color filter layer, the second color filter layer, and the third color filter layer; a second planarization layer arranged on the first planarization layer and defining a first through-hole, a second through-hole, and a third through-hole, a first quantum dot layer in the first through-hole therein; and a second quantum dot layer in the second through-hole.

In the present embodiment, the display apparatus may further include a light-transmitting layer located in the third through-hole.

In the present embodiment, the first quantum dot layer may at least partially overlap the first color filter layer, the second quantum dot layer may at least partially overlap the second color filter layer, and the light-transmitting layer may at least partially overlap the third color filter layer in a plan view.

In the present embodiment, the display apparatus may further include a light-emitting device arranged on the second planarization layer and including a light-emitting layer.

In the present embodiment, the light-emitting device may further include a pixel electrode and an opposite electrode corresponding to the pixel electrode, and the light-emitting layer may be arranged on the pixel electrode to be interposed between the pixel electrode and the opposite electrode.

In the present embodiment, the pixel electrode may be directly arranged on the first quantum dot layer.

In the present embodiment, the display apparatus may further include a protective layer arranged between the pixel electrode and the first quantum dot layer.

In the present embodiment, the first quantum dot layer may be interposed between the first color filter layer and the light-emitting device.

In the present embodiment, the display apparatus may further include a transistor interposed between the first color filter layer and the first quantum dot layer.

In the present embodiment, the transistor may not overlap the first color filter layer in the plan view.

In the present embodiment, the display apparatus may further include a connection electrode arranged on the transistor, and the connection electrode may electrically connect the transistor to the light-emitting device.

In the present embodiment, the display apparatus may further include a light-shielding electrode arranged on the transistor.

In the present embodiment, the second planarization layer may have a maximum thickness of about 10 micrometers (μm) to about 15 μm.

In the present embodiment, the first planarization layer may have a maximum thickness of about 8 μm to about 13 μm.

In the present embodiment, a bottom surface of each of the first through-hole, the second through-hole, and the third through-hole may be convex in a direction approaching the overcoat layer.

According to one or more embodiments, a method of manufacturing a display apparatus includes: forming a transistor on a first carrier substrate; forming a first color filter layer, a second color filter layer, and a third color filter layer on the transistor; forming a second carrier substrate on the first color filter layer, the second color filter layer, and the third color filter layer, and then inverting the first carrier substrate; removing the first carrier substrate; forming a first quantum dot layer, a second quantum dot layer, and a light-transmitting layer on the transistor; and forming a light-emitting device on the first quantum dot layer, the second quantum dot layer, and the light-transmitting layer.

In the present embodiment, the method may further include, before forming the transistor on the first carrier substrate, forming a first planarization layer on the first carrier substrate, and forming a connection electrode on the first planarization layer.

In the present embodiment, the connection electrode may electrically connect the transistor to the light-emitting device.

In the present embodiment, the forming of the transistor on the first carrier substrate may include: forming a semiconductor layer on the first carrier substrate; forming a gate insulating layer on the semiconductor layer; and forming a gate electrode on the gate insulating layer.

In the present embodiment, the method may further include, after forming the first color filter layer, the second color filter layer, and the third color filter layer, forming an overcoat layer on the first color filter layer, the second color filter layer, and the third color filter layer.

In the present embodiment, the overcoat layer may have a thickness of about 50 μm to about 70 μm.

In the present embodiment, the method may further include, after removing the first carrier substrate, forming a second planarization layer defining a first through-hole, a second through-hole, and a third through-hole therein, on the first planarization layer.

In the present embodiment, the second planarization layer may have a maximum thickness of about 10 μm to about 15 μm.

In the present embodiment, the first quantum dot layer may be formed in the first through-hole, the second quantum dot layer may be formed in the second through-hole, and the light-transmitting layer may be formed in the third through-hole.

In the present embodiment, the first planarization layer may have a maximum thickness of about 8 μm to about 13 μm.

In the present embodiment, the first quantum dot layer may at least partially overlap the first color filter layer, the second quantum dot layer may at least partially overlap the second color filter layer, and the light-transmitting layer may at least partially overlap the third color filter layer in a plan view.

In the present embodiment, the light-emitting device may include a pixel electrode, an opposite electrode arranged to face the pixel electrode, and a light-emitting layer between the pixel electrode and the opposite electrode.

In the present embodiment, in the light-emitting device, the pixel electrode may be directly formed on the first quantum dot layer.

In the present embodiment, the first quantum dot layer may be interposed between the first color filter layer and the light-emitting device.

In the present embodiment, the method may further include, after forming the light-emitting device, forming an encapsulation member on the light-emitting device, and removing the second carrier substrate.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 5 to 24 are cross-sectional views illustrating a process of manufacturing a portion of a display apparatus according to an embodiment;

DETAILED DESCRIPTION

Figure 1:
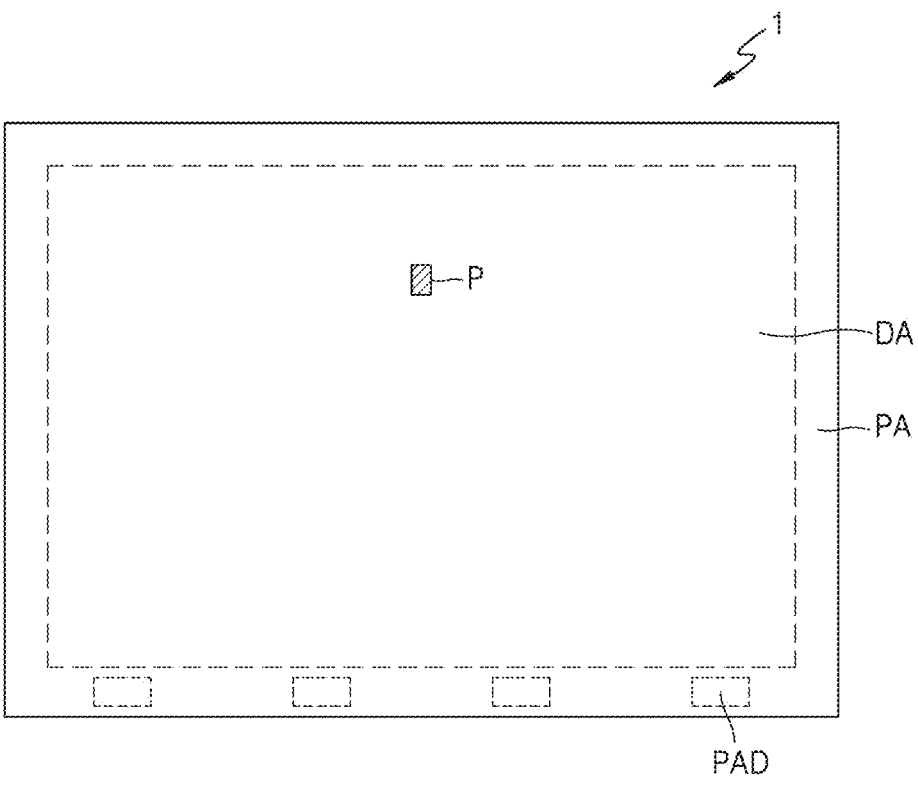
FIG. 1 is a plan view of a portion of a display apparatus according to an embodiment.
Figure 1:
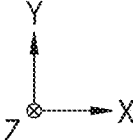

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, certain embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed/disposed on" another layer, area, or element, it can be directly or indirectly formed/disposed on the other layer, region, or element. That is, for example, intervening layers, regions, or elements may be present.

Sizes of elements in the drawings may be exaggerated for convenience of explanation. In other words, since sizes and thicknesses of elements in the drawings are arbitrarily illustrated for convenience of description, the following embodiments are not limited thereto.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. In the specification, the term "A and/or B" refers to the case of A or B, or A and B. In the specification, the term "at least one of A and B" refers to the case of A or B, or A and B.

In the following embodiments, the term "extension of a conductive line in a first direction or a second direction" means not only linear extension but also zigzag or curved extension in the first direction or the second direction.

In the following embodiments, the term "in a plan view" means that an object is viewed from above (i.e., from a Z direction. Here, the Z direction corresponds to a thickness direction of a display apparatus), and the term "in a cross-sectional view" means that a vertical section of an object is viewed from the side. In the following embodiments, "overlap" includes overlap "planar" overlap and "cross-sectional" overlap.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments will be described in detail with reference to the accompanying drawings. The same reference numerals are used to denote the same elements.

FIG. 1 is a plan view of a portion of a display apparatus 1 according to an embodiment.

Referring to FIG. 1, the display apparatus 1 may include a display area DA and a peripheral area PA around the display area DA. The peripheral area PA may be a kind of non-display area in which light-emitting devices are not arranged. In an embodiment, the peripheral area PA may at least partially surround the display area DA.

In an embodiment, the display area DA may have a rectangular shape as shown in FIG. 1. In an embodiment, the display area DA may be provided in various shapes such as a polygonal shape such as a triangle, a pentagon, or a hexagon, or an irregular shape such as a round shape, an oval shape, or an irregular shape.

The display apparatus 1 may include a plurality of pixels P arranged in the display area DA. The pixels P may be arranged in various forms, such as a stripe arrangement and a pentile arrangement, to implement an image.

In the peripheral area PA of the display apparatus 1, various wires for transmitting an electrical signal to be applied to the display area DA, and pad units PAD to which a printed circuit board or a driver IC chip is attached may be located.

Figure 2:
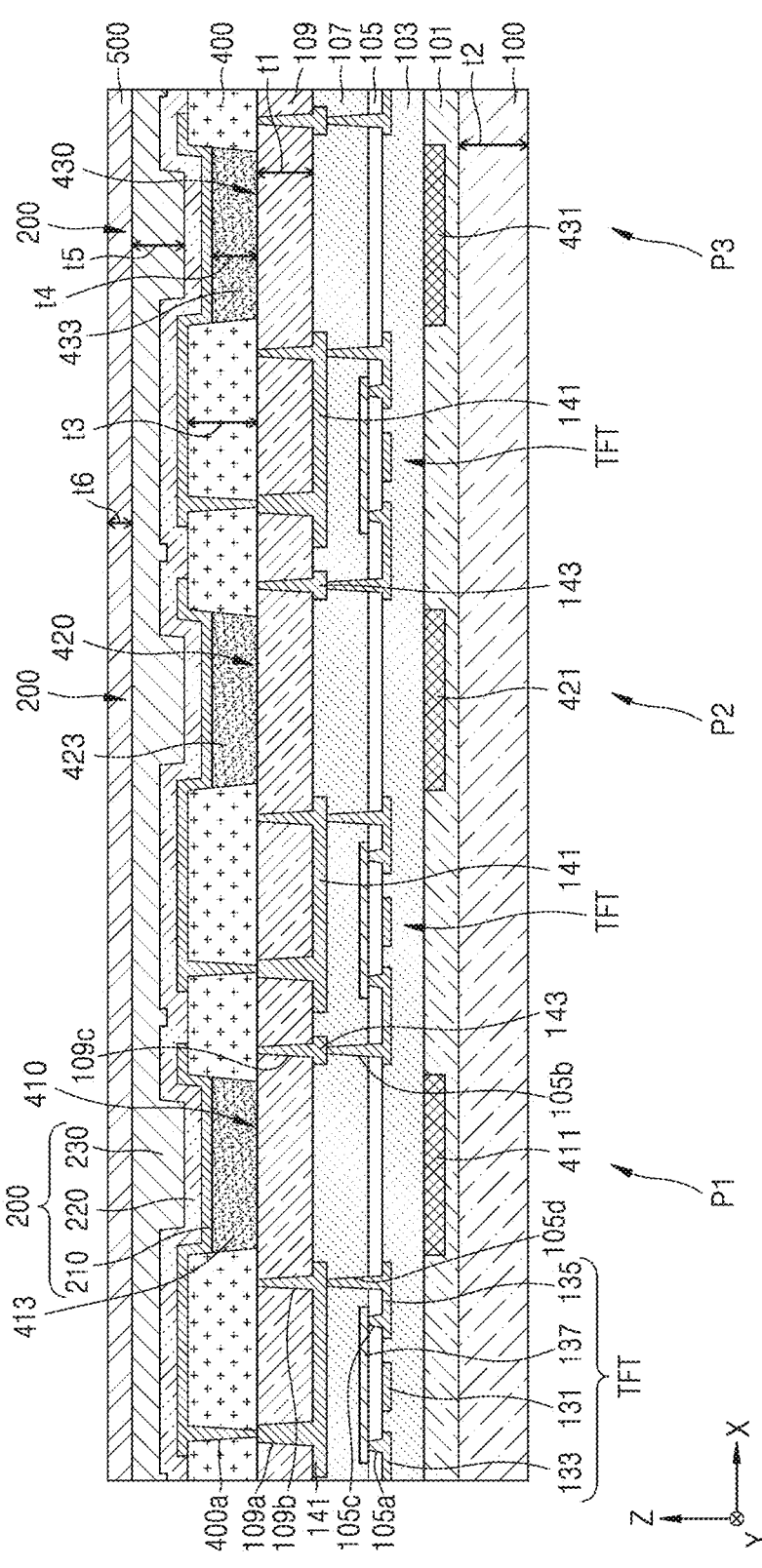
FIG. 2 is a cross-sectional view of a portion of a display apparatus according to an embodiment.

FIG. 2 is a cross-sectional view schematically illustrating a portion of the display apparatus 1 according to an embodiment. As shown in FIG. 2, the display apparatus 1 according to an embodiment may include a first pixel P1, a second pixel P2, and a third pixel P3. However, this is only an example, and the display apparatus 1 may include more pixels than the three pixels. In addition, although the first pixel P1 to the third pixel P3 are illustrated as being adjacent to each other in FIG. 2, the disclosure is not limited thereto. That is, components such as other wires may be interposed between the first pixel P1 to the third pixel P3. Accordingly, the first pixel P1 to the third pixel P3 may not be pixels located adjacent to each other.

In an embodiment, the display apparatus 1 may include an overcoat layer 100. In an embodiment, the overcoat layer 100 may include glass, metal, or polymer resin. In another embodiment, the overcoat layer 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate such that the overcoat layer 100 is flexible or bendable. In another embodiment, the overcoat layer 100 may have a multi-layer structure including two layers each containing such a polymer resin and a barrier layer containing an inorganic material interposed between the two layers, and various modifications for the structure of the overcoat layer 100 are possible.

In an embodiment, the overcoat layer 100 may have a thickness of 50 micrometers ($\mu$m) to 70 $\mu$m (e.g., a second thickness t2). if the thickness of the overcoat layer 100 is less than 50 $\mu$m, as will be described later below, in a process of removing a second carrier substrate 70 (of FIG. 23) formed on the overcoat layer 100, curling may occur in the overcoat layer 100. On the other hand, if the thickness of the overcoat layer 100 exceeds 70 $\mu$m, the flexibility of the overcoat layer 100 may be reduced, and thus, flexible or bendable characteristics of the display apparatus including the overcoat layer 100 may be deteriorated. Accordingly, when the overcoat layer 100 is provided with a thickness of 50 $\mu$m to 70 $\mu$m, it is possible to effectively prevent or minimize the occurrence of curling in the overcoat layer 100, and to secure the flexibility of the overcoat layer 100, thereby improving the flexible or bendable characteristics of the display apparatus including the overcoat layer 100.

A second insulating layer 101 may be arranged on the overcoat layer 100. The second insulating layer 101 may be formed as a single layer or multiple layers constituting a film including an organic material or an inorganic material. In an embodiment, the second insulating layer 101 may include a general polymer such as benzocyclobutene ("BCB"), polyimide ("PI"), hexamethyldisiloxane ("HMDSO"), polymethylmethacrylate ("PMMA"), and polystyrene ("PS"), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. In an embodiment, the second insulating layer 101 may include $SiO_X$, $SiN_X$, $SiO_XN_Y$, $Al_2O_3$, $TiO_2$, $Ta_2O_5$, $HfO_2$, or $ZnO$.

A first insulating layer 103 may be on the second insulating layer 101. In an embodiment, the first insulating layer 103 may include the same material as the material of the second insulating layer 101. In another embodiment, the first insulating layer 103 may include a material different from the material of the second insulating layer 101.

A first color filter layer 411, a second color filter layer 421, and a third color filter layer 431 may be interposed between the second insulating layer 101 and the first insulating layer 103. In an embodiment, the first color filter layer 411 may pass only light having a wavelength in the range of 630 nanometers (nm) to 780 nm, the second color filter layer 421 may pass only light having a wavelength in the range of 495 nm to 570 nm, and the third color filter layer 431 may pass only light having a wavelength in the range of 450 nm to 495 nm. However, the disclosure is not limited thereto.

In an embodiment, the first color filter layer 411 to the third color filter layer 431 may reduce reflection of external light in the display apparatus 1.

In an embodiment, a transistor TFT may be on the first insulating layer 103. In an embodiment, the transistor TFT may include a gate electrode 131, a source electrode 133, a drain electrode 135, and a semiconductor layer 137.

In an embodiment, the gate electrode 131, the source electrode 133, and the drain electrode 135 may be arranged on the first insulating layer 103. In an embodiment, the gate electrode 131, the source electrode 133, and the drain electrode 135 may be formed in the same layer. However, the disclosure is not limited thereto. For example, the gate electrode 131 and the source electrode 133 may be arranged in different layers from each other, and the source electrode 133 and the drain electrode 135 may be arranged in the same layer.

In an embodiment, the gate electrode 131, the source electrode 133, and the drain electrode 135 may be a single layer or multiple layers of at least one of Al, Pt, Pd, Ag, Mg, Au, Ni, Nd, Ir, Cr, Li, Ca, Mo, Ti, W, and Cu.

A gate insulating layer 105 may be arranged on the gate electrode 131, the source electrode 133, and the drain electrode 135. In an embodiment, the gate insulating layer 105 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the gate insulating layer 105 may be provided as a single layer or multiple layers including the above-described inorganic insulating material.

The semiconductor layer 137 may be arranged on the gate insulating layer 105. In an embodiment, the semiconductor layer 137 may include a channel area overlapping the gate electrode 131, and a source area and a drain area arranged on opposite sides of the channel area and including impurities having a higher concentration than impurity of the channel area. The source area and the drain area may be electrically connected to the source electrode 133 and the drain electrode 135 through contact holes 105a and 105c defined in the gate insulating layer 105, respectively.

The semiconductor layer 137 may include an oxide semiconductor and/or a silicon semiconductor. In an embodiment, when the semiconductor layer 137 is formed of an oxide semiconductor, the semiconductor layer 137 may include an oxide of at least one material selected from indium (In), gallium (Ga), tin (Sn), zirconium (Zr), vanadium (V), hafnium (Hf), cadmium (Cd), germanium (Ge), chromium (Cr), Ti, and zinc (Zn). For example, the semiconductor layer 137 may be made of ITZO (InSnZnO), IGZO (InGaZnO), or the like. In an embodiment, when the semiconductor layer 137 is formed of a silicon semiconductor, the semiconductor layer 137 may include amorphous silicon (a-Si) or low temperature poly-silicon ("LTPS") crystallized from amorphous silicon (a-Si).

A buffer layer 107 may be arranged on the semiconductor layer 137. The buffer layer 107 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the buffer layer 107 may be provided as a single layer or multiple layers including the above-described inorganic insulating material.

A connection electrode 141 and a light-shielding electrode 143 may be arranged on the buffer layer 107. In an embodiment, the connection electrode 141 and the light-shielding electrode 143 may be arranged in the same layer. However, the disclosure is not limited thereto. For example, the connection electrode 141 and the light-shielding electrode 143 may be arranged in different layers from each other.

In an embodiment, the connection electrode 141 and the light-shielding electrode 143 each may be a single layer or multiple layers of at least one of Al, Pt, Pd, Ag, Mg, Au, Ni, Nd, Ir, Cr, Li, Ca, Mo, Ti, W, and Cu. Alternatively, the connection electrode 141 and the light-shielding electrode 143 each may include at least one of indium tin oxide ("ITO"), indium zinc oxide ("IZO"), zinc oxide (ZnO), indium oxide ($In_2O_3$), indium gallium oxide ("IGO"), or aluminum zinc oxide ("AZO").

In an embodiment, as will be described later in FIG. 6, the connection electrode 141 may include a second conductive layer 141b (of FIG. 6) and a first conductive layer 141a (of FIG. 6) sequentially stacked on the buffer layer 107. In this case, the second conductive layer 141b may include a metal having good conductivity, and the first conductive layer 141a may include a metal having good strength, rigidity, and corrosion resistance. For example, the second conductive layer 141b may be made of Cu, and the first conductive layer 141a may be made of Ti or ITO.

A first planarization layer 109 may be arranged on the connection electrode 141 and the light-shielding electrode 143. In an embodiment, the first planarization layer 109 may be formed of or include a polymer resin. For example, the first planarization layer 109 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

In an embodiment, the first planarization layer 109 may have a maximum thickness of 3 μm to 4 μm (e.g., a first thickness t1). If the thickness of the first planarization layer 109 is less than 3 μm, the flatness of the first planarization layer 109 may be reduced. On the other hand, if the thickness of the first planarization layer 109 is greater than 4 μm, it may be difficult to form a contact hole through which the connection electrode 141 is electrically connected to a pixel electrode to be described later below. For example, as the thickness of the first planarization layer 109 increases, the area of the contact hole through which the connection electrode 141 is electrically connected to the pixel electrode increases, which may make it difficult to realize high resolution.

Accordingly, because the first planarization layer 109 is provided with a maximum thickness of 3 μm to 4 μm, the flatness of the first planarization layer 109 may be secured, and a contact hole may be easily formed in the first planarization layer 109.

In an embodiment, the first planarization layer 109 may define contact holes 109a, 109b, and 109c therein. In an embodiment, the connection electrode 141 may be electrically connected to a pixel electrode to be described later below through the contact hole 109a. In addition, the connection electrode 141 may be arranged in the contact hole 109b defined in the first planarization layer 109, and the light-shielding electrode 143 may be arranged in the contact hole 109c defined in the first planarization layer 109.

In an embodiment, the source electrode 133 may be electrically connected to the light-shielding electrode 143 through a contact hole 105b defined in the gate insulating layer 105 and the buffer layer 107. In an embodiment, the drain electrode 135 may be electrically connected to the connection electrode 141 through a contact hole 105d defined in the gate insulating layer 105 and the buffer layer 107.

In an embodiment, the contact holes 105b and 105d defined in the gate insulating layer 105 and the buffer layer 107 and the contact holes 109b and 109c defined in the first planarization layer 109 may surround at least a portion of each of the pixels P1, P2 and P3.

In an embodiment, metals may be arranged in the contact holes 105b and 105d defined in the gate insulating layer 105 and the buffer layer 107 and the contact holes 109b and 109c defined in the first planarization layer 109. In more detail, the source electrode 133 and/or a drain electrode 135 may be arranged in the contact holes 105b and 105d defined in the gate insulating layer 105 and the buffer layer 107, and the connection electrode 141 and/or the light-shielding electrode 143 may be arranged in the contact holes 109b and 109c defined in the first planarization layer 109.

In an embodiment, by disposing metals in the contact holes 105b and 105d defined in the gate insulating layer 105 and the buffer layer 107 and the contact holes 109b and 109c defined in the first planarization layer 109, it is possible to effectively prevent or minimize color mixing of lights emitted from light-emitting devices to be described later below. For example, by disposing metals in the contact holes 105b and 105d defined in the gate insulating layer 105 and the buffer layer 107 and the contact holes 109b and 109c defined in the first planarization layer 109, it is possible to effectively prevent lights emitted from adjacent light-emitting devices 200 and respectively passing through a first quantum dot layer 413, a second quantum dot layer 423, and a light-transmitting layer 433 from mixing with each other.

In addition, in an embodiment, the source electrode 133 and the drain electrode 135 are electrically connected to the light-shielding electrode 143 and the connection electrode 141 through the contact holes 105c and 105d, respectively, defined in the gate insulating layer 105 and the buffer layer 107, so that the transistor TFT may be stabilized. However, the disclosure is not limited thereto.

A second planarization layer 400 may be arranged directly on the first planarization layer 109. In an embodiment, the second planarization layer 400 may be formed of or include a polymer resin. For example, the second planarization layer 400 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

In an embodiment, the second planarization layer 400 may define a first through-hole 410 to a third through-hole 430 therein corresponding to the first color filter layers 411 to 431, respectively. For example, the first through-hole 410 may at least partially overlap the first color filter layer 411 in the plan view, the second through-hole 420 may at least partially overlap the second color filter layer 421 in the plan view, and the third through-hole 430 may at least partially overlap the third color filter layer 431 in the plan view.

In an embodiment, the first quantum dot layer 413 may be located in the first through-hole 410, the second quantum dot layer 423 may be positioned in the second through-hole 420, and the light-transmitting layer 433 may be positioned in the third through-hole 430.

In an embodiment, the first quantum dot layer 413 may at least partially overlap the first color filter layer 411, the second quantum dot layer 423 may at least partially overlap the second color filter layer 421, and the light-transmitting layer 433 may at least partially overlap the third color filter layer 431.

In an embodiment, the second planarization layer 400 may be provided with a maximum thickness of 10 µm to 15 µm (e.g., a third thickness t3) from an upper surface (or one side) of the first planarization layer 109. If a maximum thickness of the second planarization layer 400 is less than 10 µm, the amount of the quantum dot layers 413 and 423 arranged in the through-holes 410, 420, and 430 provided in the second planarization layer 400 decreases, so that the luminous efficiency may be reduced, or when the area is increased to secure the amount of the quantum dot layers 413 and 423 arranged in the through-holes 410, 420, and 430, it may be difficult to realize high resolution. On the other hand, if the thickness of the second planarization layer 400 is greater than 15 µm, it may be difficult to form a contact hole through which the connection electrode 141 is electrically connected to a pixel electrode 210 to be described later below. For example, as the thickness of the second planarization layer 400 increases, the area of the contact hole through which the connection electrode 141 is electrically connected to the pixel electrode 210, and thus it may be difficult to realize high resolution. In addition, if the thickness of the second planarization layer 400 is greater than 15 µm, the amount of material for forming the quantum dot layers 413 and 423 arranged in the through-holes 410, 420, and 430 provided in the second planarization layer 400 may increase. Accordingly, because the second planarization layer 400 is provided with a maximum thickness of 10 µm to 15 µm, luminous efficiency may be effectively improved, a high-resolution display apparatus may be realized, and the amount of material forming the quantum dot layers 413 and 423 may be reduced.

In an embodiment, the first quantum dot layer 413 may be provided with a maximum thickness of 8 µm to 13 µm (e.g., a fourth thickness t4) from the upper surface (or one side) of the first planarization layer 109. If a maximum thickness of the first quantum dot layer 413 is less than 8 µm, luminous efficiency may be reduced. On the other hand, if the thickness of the first quantum dot layer 413 exceeds 13 µm, there is a case where the first quantum dot layer 413 is formed outside the first through-hole 410 defined in the second planarization layer 400, so that luminous efficiency may be reduced. Accordingly, because the first quantum dot layer 413 has a maximum thickness of 8 µm to 13 µm, the luminous efficiency of the display apparatus may be improved.

In addition, each of the second quantum dot layer 423 and the light-transmitting layer 433 may also be provided with a maximum thickness of 8 µm to 13 µm (e.g., the fourth thickness t4) from the upper surface (or one side) of the first planarization layer 109.

In an embodiment, the light-emitting device 200 may be disposed on the first quantum dot layer 413, the second quantum dot layer 423, and the light-transmitting layer 433. In an embodiment, the light-emitting device 200 may include the pixel electrode 210, an intermediate layer 220, and an opposite electrode 230 sequentially stacked. In an embodiment, the pixel electrode 210 may be patterned to correspond to each of the pixels P1, P2, and P3, and the intermediate layer 220 and the opposite electrode 230 may be integrally provided.

In an embodiment, the light-emitting device 200 may be an organic light-emitting diode ("OLED") or an inorganic light-emitting diode ("ILED"), and various modifications are possible.

The pixel electrode 210 may be arranged on the second planarization layer 400. As described above, the pixel electrode 210 may be patterned to correspond to each of the pixels P1, P2, and P3. In an embodiment, the pixel electrode 210 may be directly arranged on the first quantum dot layer 413, the pixel electrode 210 may be directly arranged on the second quantum dot layer 423, and the pixel electrode 210 may be arranged directly on the light-transmitting layer 433.

In an embodiment, in the pixel electrode 210, a transparent or semi-transparent electrode layer may include at least one selected from the group consisting of ITO, IZO, ZnO, $In_2O_3$, IGO, or AZO.

In an embodiment, the pixel electrode 210 may be electrically connected to the transistor TFT through a contact hole 400a defined in the second planarization layer 400. In more detail, the pixel electrode 210 and the connection electrode 141 are electrically connected to each other through the contact hole 400a defined in the second planarization layer 400 and the contact hole 109*a* defined in the first planarization layer 109, and the source electrode 133 and/or the drain electrode 135 of the transistor TFT are electrically connected to each other through the contact hole 105*d* defined in the gate insulating layer 105 and the buffer layer 107, so that the pixel electrode 210 may be electrically connected to the transistor TFT.

The intermediate layer 220 including a light-emitting layer may be arranged on the pixel electrode 210. In an embodiment, the intermediate layer 220 including the light-emitting layer may be integrally provided on the pixel electrode 210 patterned to correspond to each of the pixels P1, P2, and P3. However, the disclosure is not limited thereto.

Figure 3:
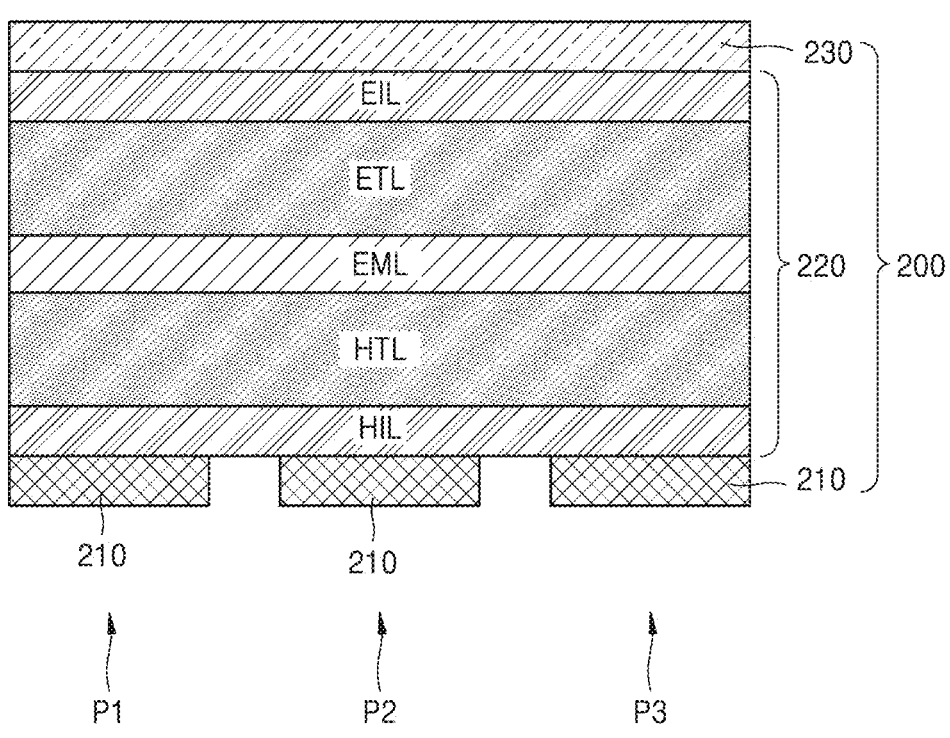
FIG. 3 is a cross-sectional view of a light-emitting device that may be employed in a display apparatus according to an embodiment.

FIG. 3 is a cross-sectional view of a light-emitting device 200 that may be employed in a display apparatus according to an embodiment.

Referring to FIG. 3, the pixel electrode 210 of the light-emitting device 200 may be patterned for each of the first pixels P1 to the third pixels P3. In an embodiment, the intermediate layer 220 and the opposite electrode 230 of the light-emitting device 200 may be integrally provided. However, the disclosure is not limited thereto.

The light-emitting device 200 may include the intermediate layer 220, and the intermediate layer 220 may include a light-emitting layer EML and a hole transport layer HTL. In addition, the intermediate layer 220 may further include a hole injection layer HIL, an electron transport layer ETL, and an electron injection layer EIL. The hole injection layer HIL may be arranged between the pixel electrode 210 and the hole transport layer HTL. The electron transport layer ETL may be arranged on the light-emitting layer EML to transport electrons from the opposite electrode 230 to the light-emitting layer EML. The electron injection layer EIL may be arranged between the electron transport layer ETL and the opposite electrode 230.

In an embodiment, the light-emitting layer EML may include an organic light-emitting material such as a high molecular weight organic material or a low molecular weight organic material that emits light of a certain color. For example, the light-emitting layer EML may be formed of or include an organic material emitting blue light. However, the disclosure is not limited thereto. In an embodiment, the light-emitting layer EML may be formed of or include an organic material emitting red or green light, or may be formed of or include an inorganic light-emitting material or quantum dots.

Figure 4:
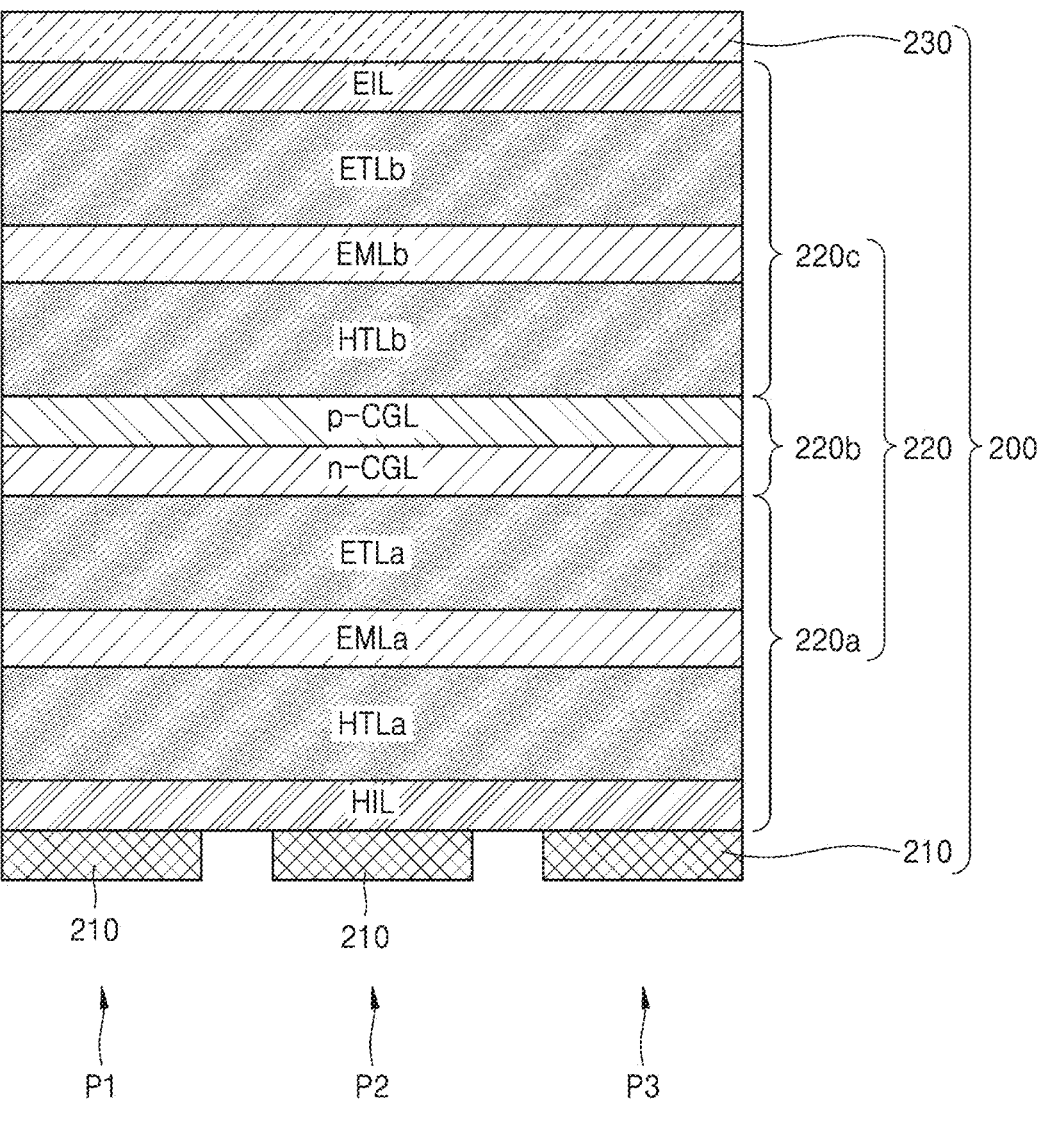
FIG. 4 is a cross-sectional view of a light-emitting device that may be employed in a display apparatus according to another embodiment.

FIG. 4 is a cross-sectional view of the light-emitting device 200 that may be employed in a display apparatus according to another embodiment. In FIG. 4, the same reference numerals in FIG. 3 denote the same elements, and a duplicate description will be omitted for simplicity.

Referring to FIG. 4, the intermediate layer 220 of the light-emitting device may be provided by stacking a plurality of light-emitting layers.

In an embodiment, the intermediate layer 220 may include a first light-emitting layer EMLa and a second light-emitting layer EMLb. The first light-emitting layer EMLa and the second light-emitting layer EMLb may be formed of or include the same material. For example, the first light-emitting layer EMLa and the second light-emitting layer EMLb may be formed of or include an organic material emitting blue light. However, the disclosure is not limited thereto. The first light-emitting layer EMLa and the second light-emitting layer EMLb may be formed of or include an organic material emitting red or green light, or may be formed of or include an inorganic light-emitting material or quantum dots.

In an embodiment, the intermediate layer 220 may include a first stack 220*a* including the first light-emitting layer EMLa, a second stack 220*c* including the second light-emitting layer EMLb, and a charge generation layer 220*b* between the first stack 220*a* and the second stack 220*c*.

In an embodiment, the first stack 220*a* may have a structure in which the hole injection layer HIL, a first hole transport layer HTLa, the first light-emitting layer EMLa, and a first electron transport layer ETLa are sequentially stacked. In an embodiment, the second stack 220*c* may have a structure in which a second hole transport layer HTLb, a second light-emitting layer EMLb, a second electron transport layer ETLb, and the electron injection layer EIL are sequentially stacked.

In an embodiment, the charge generation layer 220*b* may supply charges to the first stack 220*a* and the second stack 220*c*. In an embodiment, the charge generation layer 220*b* may include an n-type charge generation layer n-CGL for supplying charges to the first stack 220*a*, and a p-type charge generation layer p-CGL for supplying holes to the second stack 220*c*. In this case, the n-type charge generation layer n-CGL may be provided by including a metal material as a dopant.

FIG. 4 shows that the intermediate layer 220 of a light-emitting device is provided by stacking two light-emitting layers, but the disclosure is not limited thereto. Three, four, or more light-emitting layers may be stacked.

Referring back to FIG. 2, the intermediate layer 220 may include at least one light-emitting layer, and the light-emitting layer may emit light of a first wavelength band. For example, the light-emitting layer may emit light having a wavelength in the range of 450 nm to 495 nm. However, the disclosure is not limited thereto.

In an embodiment, the opposite electrode 230 may be arranged on the intermediate layer 220. In an embodiment, the opposite electrode 230 may be integrally formed in light-emitting devices. In an embodiment, the opposite electrode 230 may be a reflective electrode. For example, the opposite electrode 230 may include a reflective film formed of or include Al, Pt, Pd, Ag, Mg, Au, Ni, Nd, Ir, Cr, Li, Ca, Mo, Ti, W, Cu, or a compound thereof.

In an embodiment, the opposite electrode 230 may have a maximum thickness of 1000 angstroms (Å) or more (e.g., a fifth thickness t5). If the thickness of the opposing electrode 230 is less than 1000 angstroms (Å), the resistance of the opposing electrode 230 may increase, thereby reducing light-emitting efficiency.

In an embodiment, because the pixel electrode 210 arranged under the intermediate layer 220 including a light-emitting layer is formed as a transparent or translucent electrode, and the opposite electrode 230 arranged on the intermediate layer 220 is formed as a reflective electrode, the display apparatus 1 may be a bottom emission type in which light emitted from the light-emitting layer of the light-emitting device 200 is emitted toward the overcoat layer 100.

An encapsulation member 500 may be on the light-emitting device 200. In more detail, the encapsulation member 500 may be on the opposite electrode 230 of the light-emitting device 200. In an embodiment, the encapsulation member 500 may be made of metal. For example, the encapsulation member 500 may be formed of or include an iron (Fe)-nickel (Ni) alloy. In an embodiment, the encapsulation member 500 may be attached on the opposite electrode 230. Because the encapsulation member 500 on the light-emitting device 200 is made of metal, light emitted from the light-emitting device 200 may be partially reflected toward the overcoat layer 100 by the encapsulation member 500.

In an embodiment, the encapsulation member 500 may have a thickness of 50 μm to 150 μm (e.g., a sixth thickness t6). In more detail, the encapsulation member 500 may be provided with a thickness of 50 μm to 150 μm (e.g., the sixth thickness t6) from an upper surface (or one side) of the opposite electrode 230. If the encapsulation member 500 is provided with a thickness of less than 50 μm, sealing characteristics of the encapsulation member 500 may be deteriorated and the light-emitting device 200 may be contaminated by external foreign matter. On the other hand, if the encapsulation member 500 is provided with a thickness of more than 150 μm, flexible or bendable characteristics of the display apparatus 1 may be deteriorated. Accordingly, because the encapsulation member 500 is provided with a thickness of 50 μm to 150 μm (e.g., the sixth thickness t6), it is possible to effectively prevent or minimize contamination of the light-emitting device 200 from external foreign matter, and at the same time to implement a flexible or bendable display apparatus.

In an embodiment, because the display apparatus 1 has a bottom emission type structure, it is not necessary to form a thin film encapsulation layer TFE on the light-emitting device 200. Accordingly, because a process of forming the thin film encapsulation layer TFE on the light-emitting device 200 may be omitted, the process may be simplified compared to the conventional one.

In an embodiment, the first quantum dot layer 413 may be interposed between the light-emitting device 200 and the first color filter layer 411, the second quantum dot layer 423 may be interposed between the light-emitting device 200 and the second color filter layer 421, and the light-transmitting layer 433 may be interposed between the light-emitting device 200 and the third color filter layer 431.

The first quantum dot layer 413 may convert light of the first wavelength band generated by the intermediate layer 220 including the light-emitting layer into light of a second wavelength band. For example, when light having a wavelength in the range of 450 nm to 495 nm is generated in the intermediate layer 220 including the light-emitting layer, the first quantum dot layer 413 may convert the light into light having a wavelength in the range of 630 nm to 780 nm. Accordingly, in the first pixel P1, the light having a wavelength in the range of 630 nm to 780 nm may be emitted to the outside through the overcoat layer 100. For example, red light may be emitted from the first pixel P1.

The second quantum dot layer 423 may convert light of the first wavelength band generated by the intermediate layer 220 including the light-emitting layer into light of a third wavelength band. For example, when light having a wavelength in the range of 450 nm to 495 nm is generated in the intermediate layer 220 including the light-emitting layer, the second quantum dot layer 423 may convert the light into light having a wavelength in the range of 495 nm to 570 nm. Accordingly, in the second pixel P2, the light having a wavelength in the range of 495 nm to 570 nm may be emitted to the outside through the overcoat layer 100. For example, green light may be emitted from the second pixel P2.

Each of the first quantum dot layer 413 and the second quantum dot layer 423 may be provided in a form in which quantum dots are dispersed in a resin. A quantum dot includes semiconductor materials such as cadmium sulfide (CdS), cadmium telluride (CdTe), zinc sulfide (ZnS), or indium phosphide (InP). The size of the quantum dot may be several nanometers, and a wavelength of light after conversion varies according to the size of the quantum dot. The resin included in the first quantum dot layer 413 and the second quantum dot layer 423 may be any light-transmitting material. For example, a polymer resin such as acryl, BCB, or HMDSO may be used as a material for forming the first quantum dot layer 413 and the second quantum dot layer 423.

The third pixel P3 may emit light of the first wavelength band generated by the intermediate layer 220 including the light-emitting layer to the outside without wavelength conversion. Accordingly, the third pixel P3 may not have a quantum dot layer. As such, because a quantum dot layer is not required in the third through-hole 430, the light-transmitting layer 433 formed of or include a transmissive resin is positioned in the third through-hole 430. However, the disclosure is not limited thereto.

In an embodiment, the first color filter layer 411, the second color filter layer 421, and the third color filter layer 431 may be arranged on the overcoat layer 100. The first color filter layer 411 may pass only light having a wavelength in the range of 630 nm to 780 nm, the second color filter layer 421 may pass only light having a wavelength in the range of 495 nm to 570 nm, and the third color filter layer 431 may pass only light having a wavelength in the range of 450 nm to 495 nm. However, the disclosure is not limited thereto.

In an embodiment, the first quantum dot layer 413, the second quantum dot layer 423, and the light-transmitting layer 433 may be arranged on the first color filter layer 411, the second color filter layer 421, and the third color filter layer 431, respectively. In an embodiment, the first color filter layer 411 may at least partially overlap the first quantum dot layer 413, the second color filter layer 421 may at least partially overlap the second quantum dot layer 423, and the third color filter layer 431 may at least partially overlap the light-transmitting layer 433. In this case, the first quantum dot layer 413 may convert incident light into light having a wavelength in the range of 630 nm to 780 nm, the second quantum dot layer 423 may convert incident light into light having a wavelength in the range of 495 nm to 570 nm, and the light-transmitting layer 433 may emit incident light to the outside without wavelength conversion.

In an embodiment, the light-emitting device 200 may be arranged on the first quantum dot layer 413, the second quantum dot layer 423, and the light-transmitting layer 433. In an embodiment, the light-emitting device 200 may include the pixel electrode 210, the intermediate layer 220, and the opposite electrode 230 sequentially stacked. In this case, light having a wavelength in the range of 450 nm to 495 nm may be generated in the intermediate layer 220 including the light-emitting layer.

Because the display apparatus 1 is provided as a bottom emission type, the light generated in the intermediate layer 220 including the light-emitting layer may be emitted toward the overcoat layer 100. Accordingly, the light generated in the intermediate layer 220 including the light-emitting layer may sequentially pass through the first quantum dot layer 413 and the first color filter layer 411, may sequentially pass through the second quantum dot layer 423 and the second color filter layer 421, or may sequentially pass through the layer 433 and the third color filter layer 431.

In an embodiment, the first quantum dot layer 413 may convert incident light into light of a wavelength in the range of 630 nm to 780 nm, and because the first color filter layer

411 may pass only light having a wavelength in the range of 630 nm to 780 nm, light generated in the intermediate layer 220 including the light-emitting layer may be converted into light having a wavelength in the range of 630 nm to 780 nm by the first quantum dot layer 413, and the converted light may pass through the first color filter layer 411 and be emitted to the outside through the overcoat layer 100. Accordingly, in the first pixel P1, the light having a wavelength in the range of 630 nm to 780 nm may be emitted to the outside through the overcoat layer 100.

In an embodiment, because the second quantum dot layer 423 may convert incident light into light of a wavelength in the range of 495 nm to 570 nm and the second color filter layer 421 may pass only light having a wavelength in the range of 495 nm to 570 nm, light generated in the intermediate layer 220 including the light-emitting layer may be converted into light having a wavelength in the range of 495 nm to 570 nm by the second quantum dot layer 423, and the converted light may pass through the second color filter layer 421 and be emitted to the outside through the overcoat layer 100. Accordingly, in the second pixel P2, the light having a wavelength in the range of 495 nm to 570 nm may be emitted to the outside through the overcoat layer 100.

In an embodiment, because the light-transmitting layer 433 may emit incident light to the outside without wavelength conversion and the third color filter layer 431 may pass only light having a wavelength in the range of 450 nm to 495 nm, light generated in the intermediate layer 220 including the light-emitting layer may pass through the light-transmitting layer 433 without wavelength conversion, and the passed light may pass through the third color filter layer 431 and be emitted to the outside through the overcoat layer 100. Accordingly, in the third pixel P3, the light having a wavelength in the range of 450 nm to 495 nm may be emitted to the outside through the overcoat layer 100.

In the display apparatus 1 according to an embodiment, light in the range of 630 nm to 780 nm (e.g., the second wavelength band) may be emitted to the outside in the first pixel P1, light in the range of 495 nm to 570 nm (e.g., the third wavelength band) may be emitted to the outside in the second pixel P2, and light in the range of 450 nm to 495 nm (e.g., the first wavelength band) may be emitted to the outside in the third pixel P3. Accordingly, the display apparatus 1 may display a full color image.

In an embodiment, because a light path is formed between the first quantum dot layer 413 and the first color filter layer 411, the transistor TFT may not overlap the first quantum dot layer 413 and/or the first color filter layer 411.

In an embodiment, because a light path is formed between the second quantum dot layer 423 and the second color filter layer 421, the transistor TFT may not overlap the second quantum dot layer 423 and/or the second color filter layer 421.

In an embodiment, because a light path is formed between the light-transmitting layer 433 and the third color filter layer 431, the transistor TFT may not overlap the light-transmitting layer 433 and/or the third color filter layer 431.

FIGS. 5 to 24 are cross-sectional views illustrating a process of manufacturing a portion of a display apparatus according to an embodiment. In more detail, FIGS. 5 to 24 are cross-sectional views schematically illustrating a manufacturing process of the display apparatus 1 of FIG. 2.

Referring to FIGS. 5 to 24, the method of manufacturing the display apparatus 1 according to an embodiment may include forming the transistor TFT on a first carrier substrate 50, forming the first color filter layer 411, the second color filter layer 421, and the third color filter layer 431 on the transistor TFT, inverting the first carrier substrate 50 after forming a second carrier substrate 70 on the first color filter layer 411, the second color filter layer 421, and the third color filter layer 431, removing the first carrier substrate 50, forming the first quantum dot layer 413, the second quantum dot layer 423, and the light-transmitting layer 433 on the transistor TFT, and forming the light-emitting device 200 on the first quantum dot layer 413, the second quantum dot layer 423, and the light-transmitting layer 433.

In an embodiment, before the forming of the transistor TFT on the first carrier substrate 50, forming the first planarization layer 109 on the first carrier substrate 50 and forming the connection electrode 141 on the first planarization layer 109 may be performed.

Figure 5:
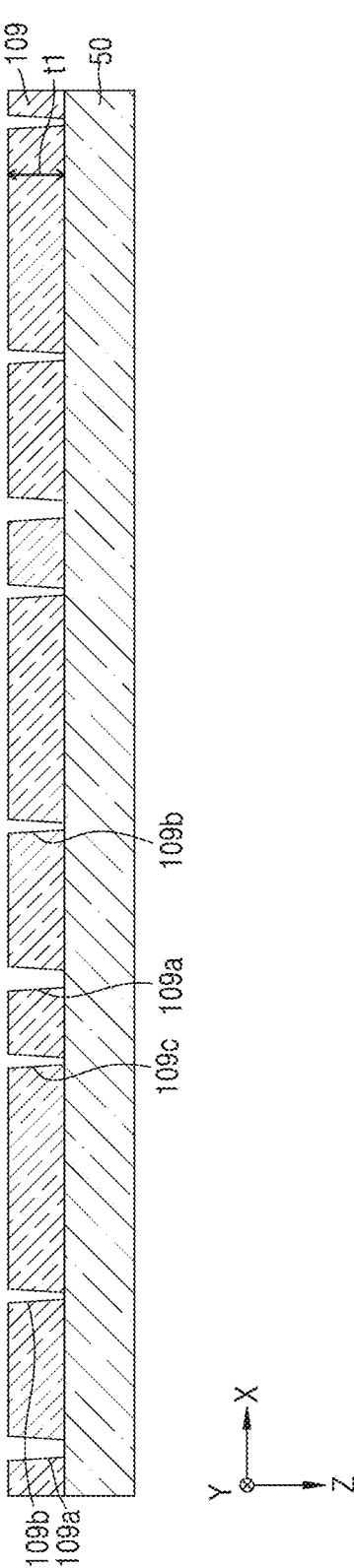

Referring to FIG. 5, the first planarization layer 109 may be formed on the first carrier substrate 50. In an embodiment, the first carrier substrate 50 may be formed of or include glass, and the first planarization layer 109 may be formed of or include a polymer resin. For example, the first planarization layer 109 may be made of polyimide.

In an embodiment, the first planarization layer 109 may include the contact holes 109a, 109b, and 109c. That is, the contact holes 109a, 109b, and 109c may be defined in the first planarization layer 109. The contact holes 109a, 109b, and 109c defined in the first planarization layer 109 may be formed by a photomask or laser drilling.

In an embodiment, the first planarization layer 109 may have a maximum thickness of about 3 μm to about 4 μm (e.g., the first thickness t1). Because the first planarization layer 109 is provided with a maximum thickness of about 3 μm to about 4 μm, the flatness of the first planarization layer 109 may be secured, and the contact holes 109a, 109b, and 109c may be easily formed in the first planarization layer 109.

Figure 6:
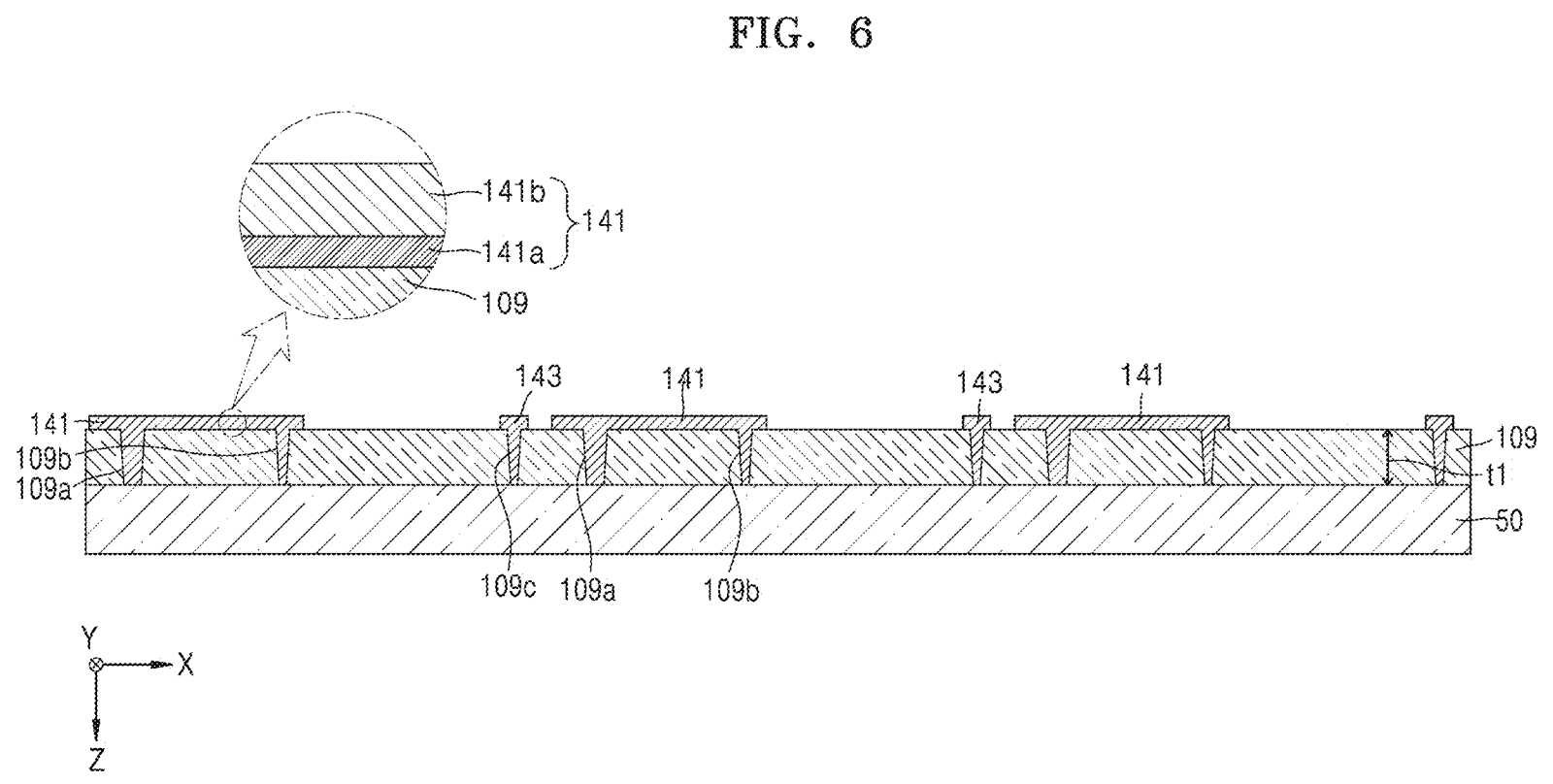

Thereafter, referring to FIG. 6, the connection electrode 141 and the light-shielding electrode 143 may be formed on the first planarization layer 109. In an embodiment, the connection electrode 141 and the light-shielding electrode 143 may be formed on the same layer.

In an embodiment, the connection electrode 141 may be arranged in the contact holes 109a and 109b defined in the first planarization layer 109, and the light-shielding electrode 143 may be arranged in the contact hole 109c defined in the first planarization layer 109.

In an embodiment, the connection electrode 141 and the light-shielding electrode 143 may be a single layer or multiple layers of at least one of Al, Pt, Pd, Ag, Mg, Au, Ni, Nd, Ir, Cr, Li, Ca, Mo, Ti, W, and Cu. Alternatively, the connection electrode 141 and the light-shielding electrode 143 may include at least one of ITO, IZO, ZnO, $In_2O_3$, IGO, or AZO.

In an embodiment, the connection electrode 141 may include the first conductive layer 141a and the second conductive layer 141b. In an embodiment, after the first conductive layer 141a is formed on the first planarization layer 109, the second conductive layer 141b may be formed on the first conductive layer 141a.

In an embodiment, the first conductive layer 141a and the second conductive layer 141b may be formed of or include different materials. For example, the first conductive layer 141a may be made of Ti or ITO, and the second conductive layer 141b may be made of Cu. In an embodiment, the first conductive layer 145a may be provided to protect the second conductive layer 145b.

When Cu is directly formed on the first planarization layer 109, the copper may be oxidized to reduce electrical conductivity of the connection electrode 141. In addition, when the connection electrode 141 has a structure in which Ti, Cu, and ITO are sequentially stacked, in a process of etching the ITO, a tip may be generated in the ITO, and cracks may occur in inorganic layers arranged on the connection electrode 141. In addition, in order to effectively prevent this, when the connection electrode 141 has a structure in which Ti, Cu, Ti, and ITO are sequentially stacked, a process for etching Ti and ITO may be added.

In an embodiment, by forming the first conductive layer 141a made of Ti on the first planarization layer 109 and forming the second conductive layer 141b made of Cu on the first conductive layer 141a, oxidation of Cu may be prevented.

In addition, as will be described later below, after sequentially stacking the first conductive layer 141a and the second conductive layer 141b on the first planarization layer 109, by inverting the first carrier substrate 50 on which the first conductive layer 141a and the second conductive layer 141b are arranged, the first conductive layer 141a may be above the second conductive layer 141b. For example, there may be a structure in which the second conductive layer 141b, the first conductive layer 141a, and the first planarization layer 109 are sequentially stacked. Because the first conductive layer 141a made of Ti is on the second conductive layer 141b made of Cu, damage to the second conductive layer 141b in a subsequent process may be effectively prevented or minimized.

In an embodiment, the light-shielding electrode 143 may also have the same structure as the connection electrode 141.

Figure 7:
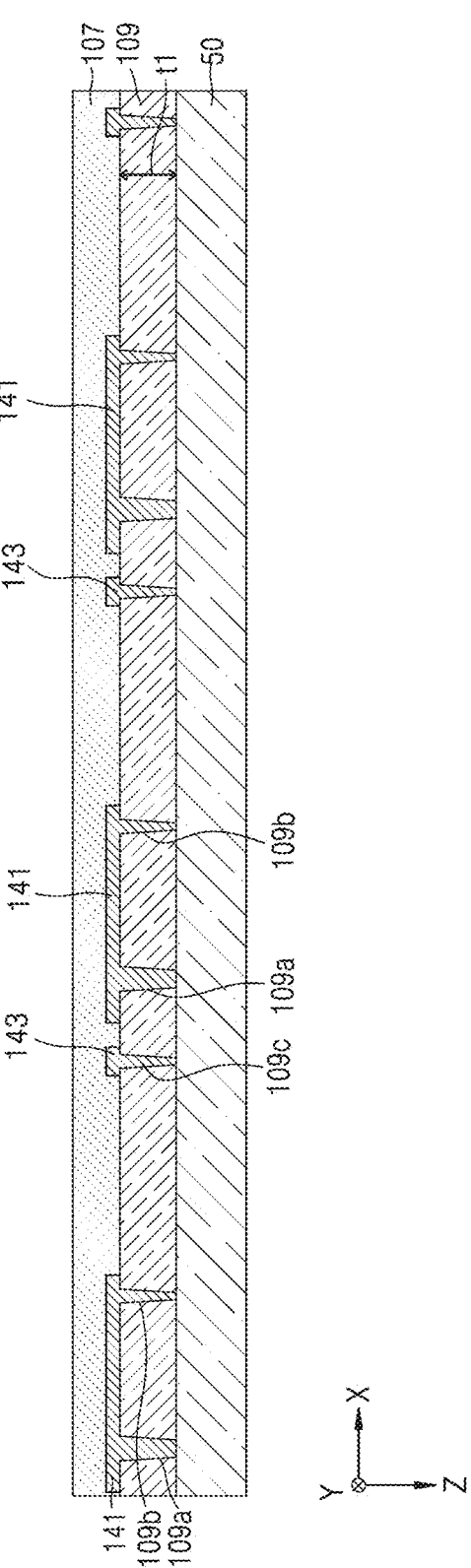

Thereafter, referring to FIG. 7, the buffer layer 107 may be formed on the connection electrode 141 and the light-shielding electrode 143. In an embodiment, the buffer layer 107 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the buffer layer 107 may be provided as a single layer or multiple layers including the above-described inorganic insulating material.

Thereafter, in an embodiment, the transistor TFT may be formed on the first carrier substrate 50. In an embodiment, the forming of the transistor TFT on the first carrier substrate 50 may include forming the semiconductor layer 137 on the first carrier substrate 50, forming the gate insulating layer 105 on the semiconductor layer 137, and forming the gate electrode 131 on the gate insulating layer 105.

Figure 8:
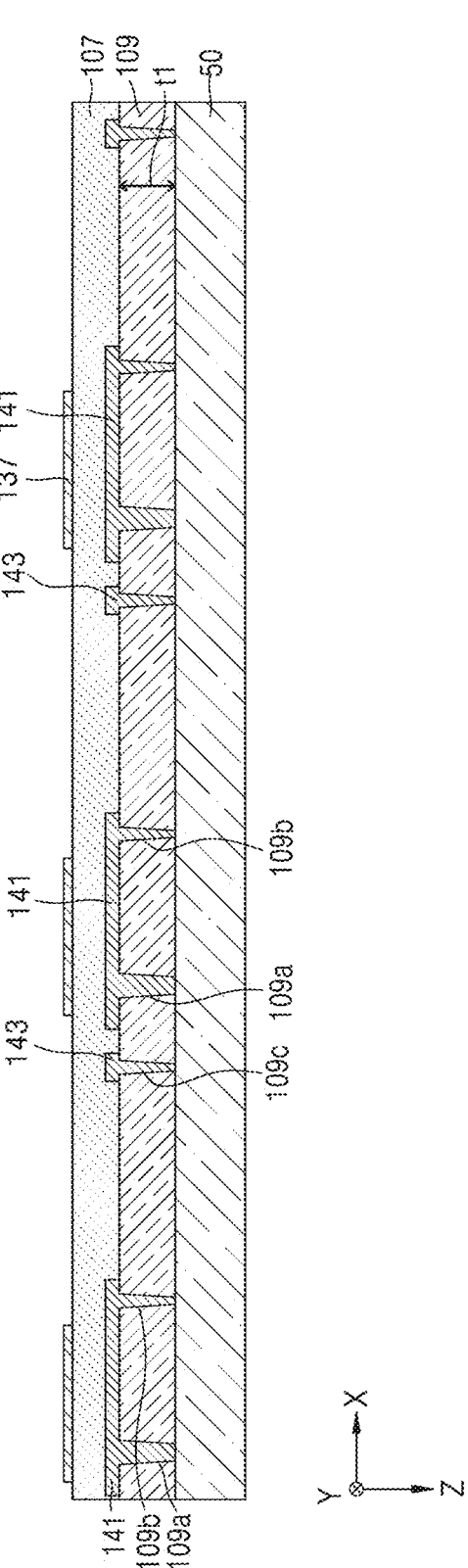

Referring to FIG. 8, the semiconductor layer 137 may be formed on the buffer layer 107. In an embodiment, the semiconductor layer 137 may include an oxide semiconductor and/or a silicon semiconductor.

Figure 9:
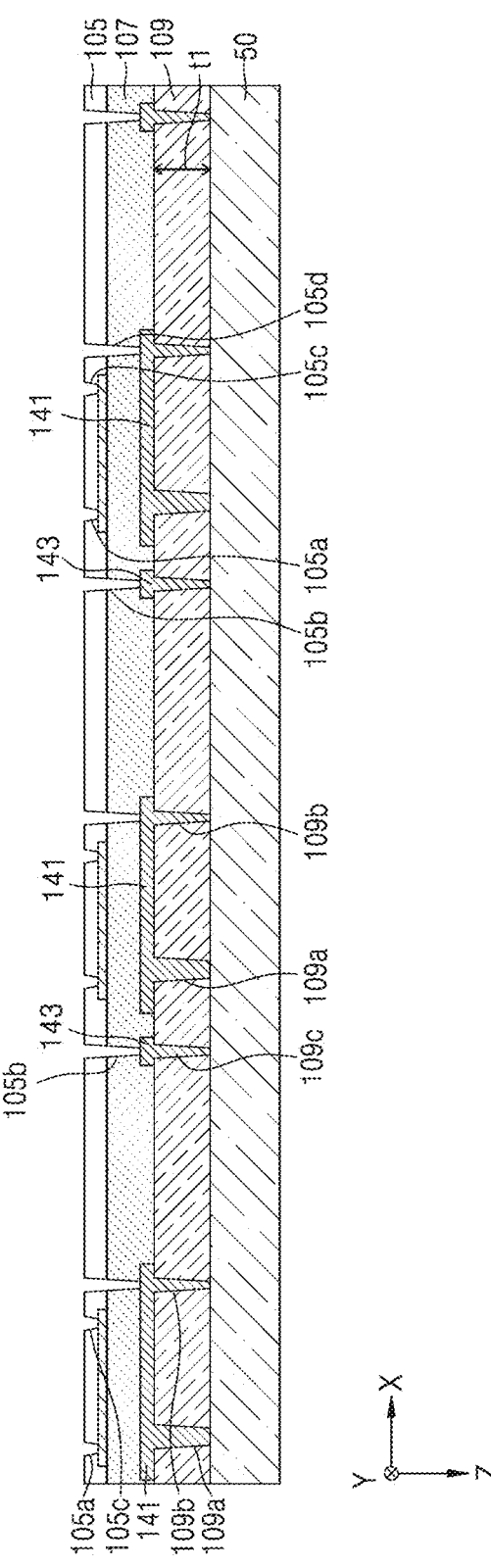

Thereafter, referring to FIG. 9, the gate insulating layer 105 may be formed on the semiconductor layer 137. In an embodiment, the gate insulating layer 105 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the gate insulating layer 105 may be provided as a single layer or multiple layers including the above-described inorganic insulating material.

In an embodiment, the gate insulating layer 105 may include the contact holes 105a, 105b, 105c, and 105d. That is, the contact holes 105a, 105b, 105c, and 105d may be defined in the gate insulating layer 105. In an embodiment, the contact holes 105b and 105d may be defined in the gate insulating layer 105 and the buffer layer 107.

Figure 10:
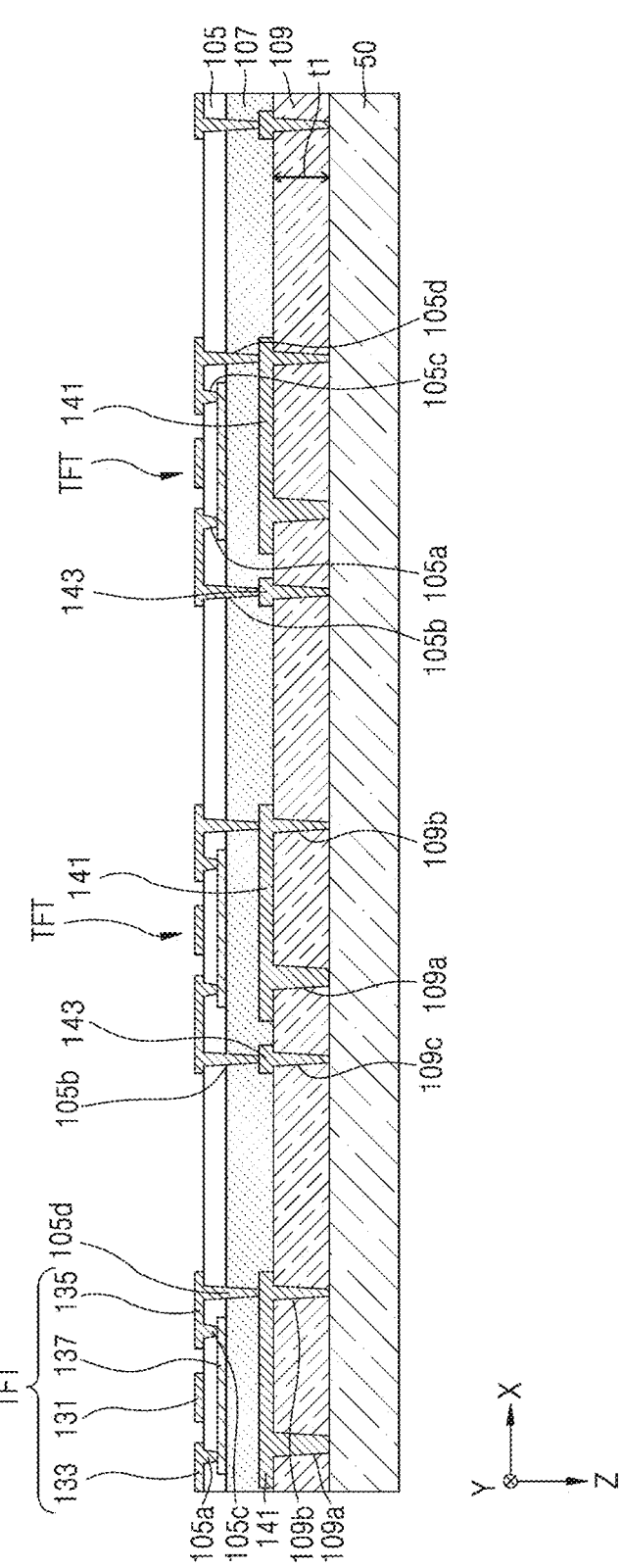

Thereafter, referring to FIG. 10, the gate electrode 131, the source electrode 133, and the drain electrode 135 may be formed on the gate insulating layer 105. In an embodiment, the gate electrode 131, the source electrode 133, and the drain electrode 135 may be formed on the same layer. However, the disclosure is not limited thereto.

In FIG. 10, the source electrode 133 is formed on the left side of the gate electrode 131 and the drain electrode 135 is formed on the right side of the gate electrode 131, but the disclosure is not limited thereto. In an embodiment, the drain electrode 135 may be formed on the left side of the gate electrode 131, and the source electrode 133 may be formed on the right side of the gate electrode 131.

In an embodiment, the gate electrode 131, the source electrode 133, and the drain electrode 135 may be a single layer or multiple layers of at least one of Al, Pt, Pd, Ag, Mg, Au, Ni, Nd, Ir, Cr, Li, Ca, Mo, Ti, W, and Cu.

In an embodiment, the gate electrode 131 may at least partially overlap the semiconductor layer 137 formed thereunder. In an embodiment, the source electrode 133 may be electrically connected to the semiconductor layer 137 through the contact hole 105a defined in the gate insulating layer 105. In addition, in an embodiment, the drain electrode 135 may be electrically connected to the semiconductor layer 137 through the contact hole 105c defined in the gate insulating layer 105. However, the disclosure is not limited thereto.

In addition, the source electrode 133 may be electrically connected to the light-shielding electrode 143 through the contact hole 105b defined in the buffer layer 107 and/or the gate insulating layer 105, and the drain electrode 135 may be electrically connected to the connection electrode 141 through the contact hole 105d defined in the buffer layer 107 and/or the gate insulating layer 105. However, the disclosure is not limited thereto.

In an embodiment, the contact hole 109b defined in the first planarization layer 109 and the contact hole 105d defined in the buffer layer 107 and/or the gate insulating layer 105 in a direction perpendicular to the first carrier substrate 50 may overlap at least partially. In addition, in an embodiment, the contact hole 109c defined in the first planarization layer 109 and the contact hole 105b defined in the buffer layer 107 and/or the gate insulating layer 105 in the direction perpendicular to the first carrier substrate 50 may overlap at least partially.

In an embodiment, metals arranged in the contact holes 105b and 105d defined the gate insulating layer 105 and/or the buffer layer 107 and the contact holes 109b and 109c defined in the first planarization layer 109 reflect incident light, thereby effectively preventing or minimizing color mixing between adjacent pixels.

In an embodiment, by electrically connecting the source electrode 133 and/or the drain electrode 135 to the connection electrode 141 through the contact hole 105d defined in the gate insulating layer 105 and the buffer layer 107, the transistor TFT may be stabilized.

Figure 11:
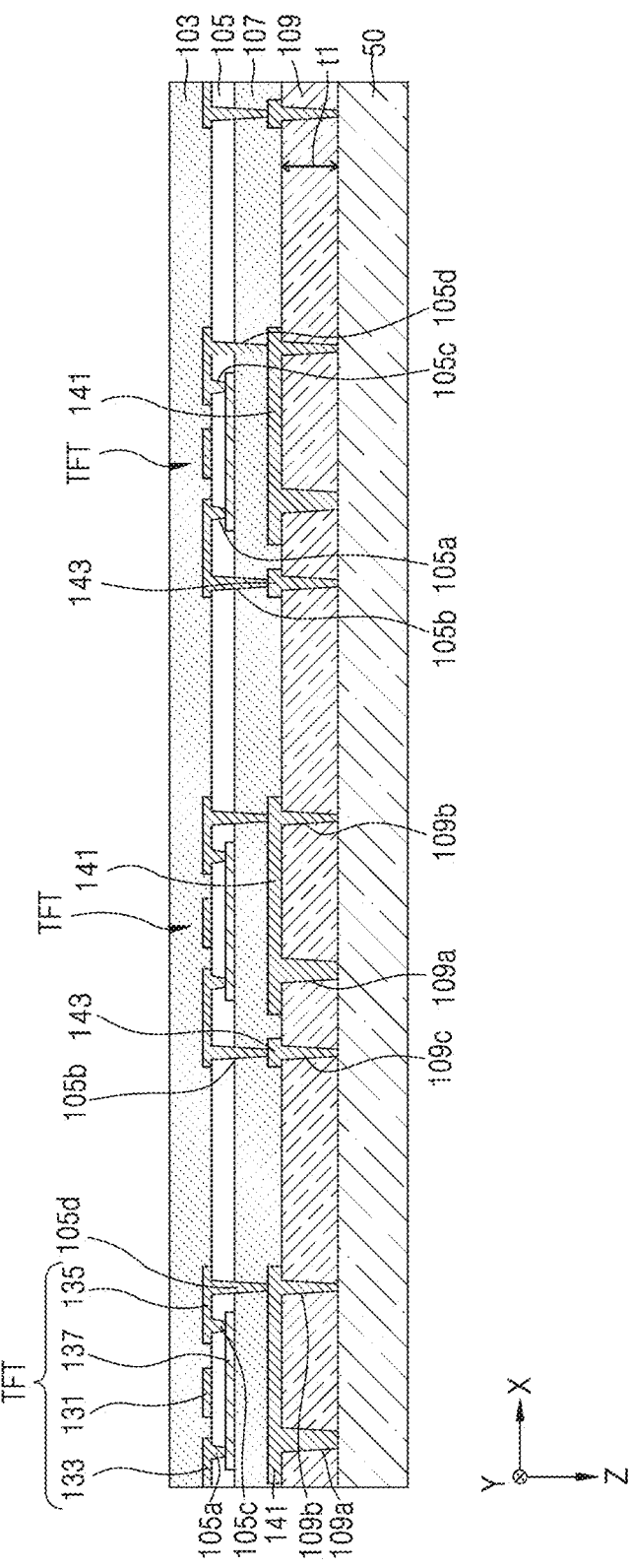

Thereafter, referring to FIG. 11, the first insulating layer 103 may be formed on the gate electrode 131, the source electrode 133, and the drain electrode 135.

In an embodiment, the first insulating layer 103 may be formed as a single layer or multiple layers constituting a film including an organic material or an inorganic material. In an embodiment, the first insulating layer 103 may include a general polymer such as BCB, PI, HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. In an embodiment, the first insulating layer 103 may include $SiO_X$, $SiN_X$, $SiO_XN_Y$, $Al_2O_3$, $TiO_2$, $Ta_2O_5$, $HfO_2$, or ZnO.

Figure 12:
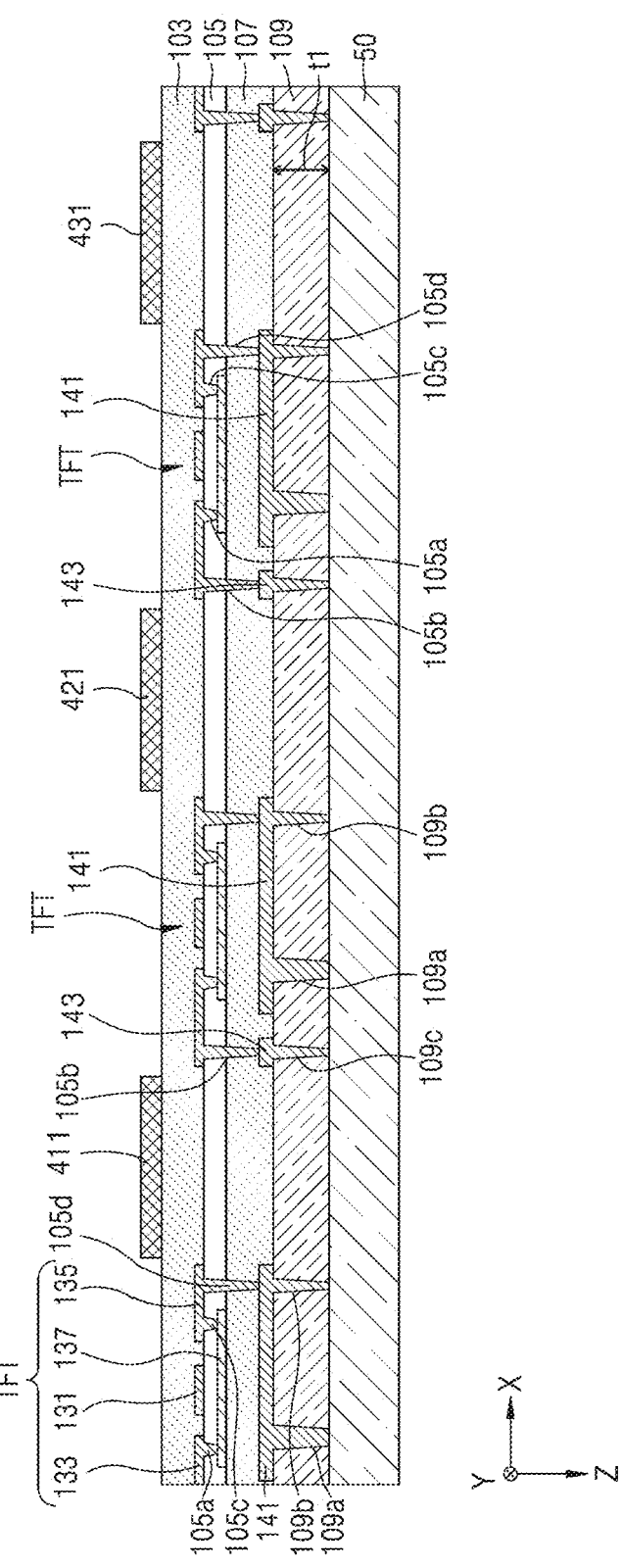

Thereafter, referring to FIG. 12, the first color filter layer 411, the second color filter layer 421, and the third color filter layer 431 may be formed on the first insulating layer 103. In an embodiment, the first color filter layer 411, the second color filter layer 421, and the third color filter layer 431 may be formed on the first insulating layer 103 by an inkjet printing method. However, the disclosure is not limited thereto.

In an embodiment, each of the first color filter layer 411, the second color filter layer 421, and the third color filter layer 431 may not overlap the transistor TFT. Because each of the first color filter layer 411, the second color filter layer 421, and the third color filter layer 431 does not overlap the transistor TFT, luminous efficiency of the display apparatus may be improved.

In an embodiment, the first color filter layer 411 may pass only light having a wavelength in the range of 630 nm to 780 nm, the second color filter layer 421 may pass only light having a wavelength in the range of 495 nm to 570 nm, and the third color filter layer 431 may pass only light having a wavelength in the range of 450 nm to 495 nm. However, the disclosure is not limited thereto.

In a case of a structure in which a transistor is formed on a first substrate and a color filter layer is formed on a second substrate, and then the first substrate and the second substrate are bonded to each other, misalignment may occur when the first substrate and the second substrate are bonded to each other, thereby reducing optical efficiency.

In the display apparatus according to the disclosure, by sequentially forming the transistor TFT and the color filter layer (e.g., the first color filter layer 411 to the third color filter layer 431) on the first carrier substrate 50, it is possible to effectively prevent or minimize misalignment in the process of bonding the first substrate and the second substrate to each other, thereby improving the optical efficiency of the display apparatus.

Figure 13:
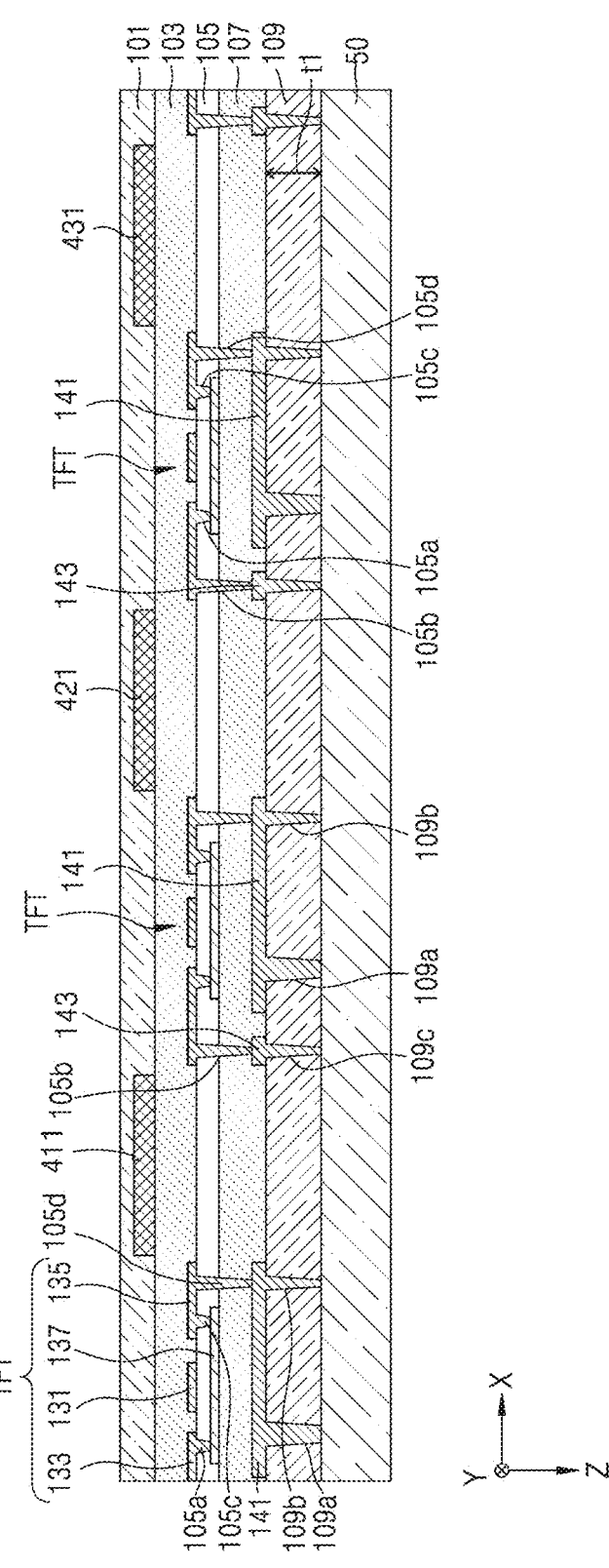

Thereafter, referring to FIG. 13, the second insulating layer 101 may be formed on the first color filter layer 411, the second color filter layer 421, and the third color filter layer 431.

In an embodiment, the second insulating layer 101 may include the same material as that of the first insulating layer 103. In an embodiment, the second insulating layer 101 may include a material different from that of the first insulating layer 103.

Figure 14:
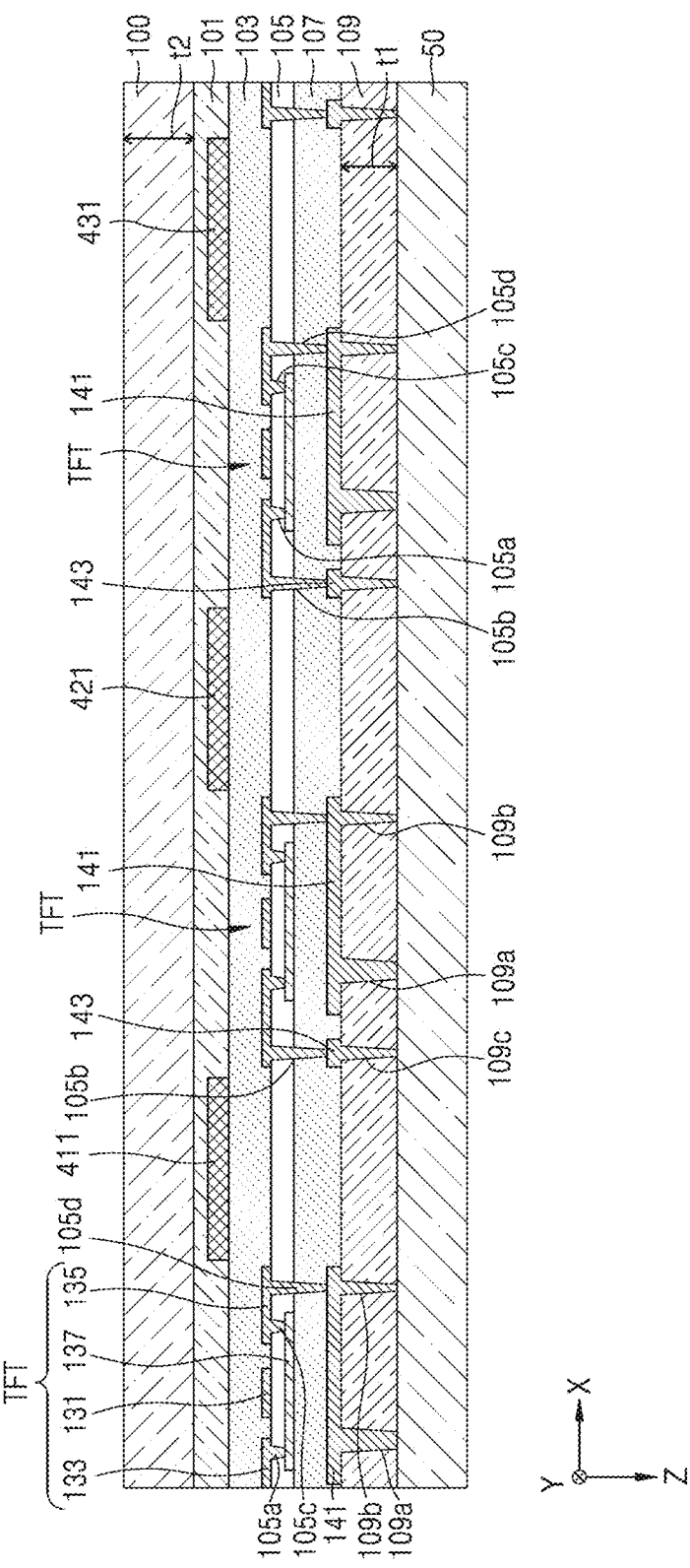

Then, referring to FIG. 14, the overcoat layer 100 may be formed on the second insulating layer 101. In an embodiment, the overcoat layer 100 may be formed of or include a polymer resin. For example, the overcoat layer 100 may be formed of or include polyarylate, polyimide, or the like.

In an embodiment, the overcoat layer 100 may have a thickness of 50 μm to 70 μm (e.g., the second thickness t2). In more detail, the overcoat layer 100 may be provided with a thickness of 50 μm to 150 μm (e.g., the second thickness t2) from an upper surface (or one side) of the second insulating layer 101. When the overcoat layer 100 is provided with a thickness of 50 μm to 70 μm, it is possible to effectively prevent or minimize the occurrence of curling in the overcoat layer 100, and to secure the flexibility of the overcoat layer 100, thereby improving the flexible or bendable characteristics of the display apparatus including the overcoat layer 100.

Figure 15:
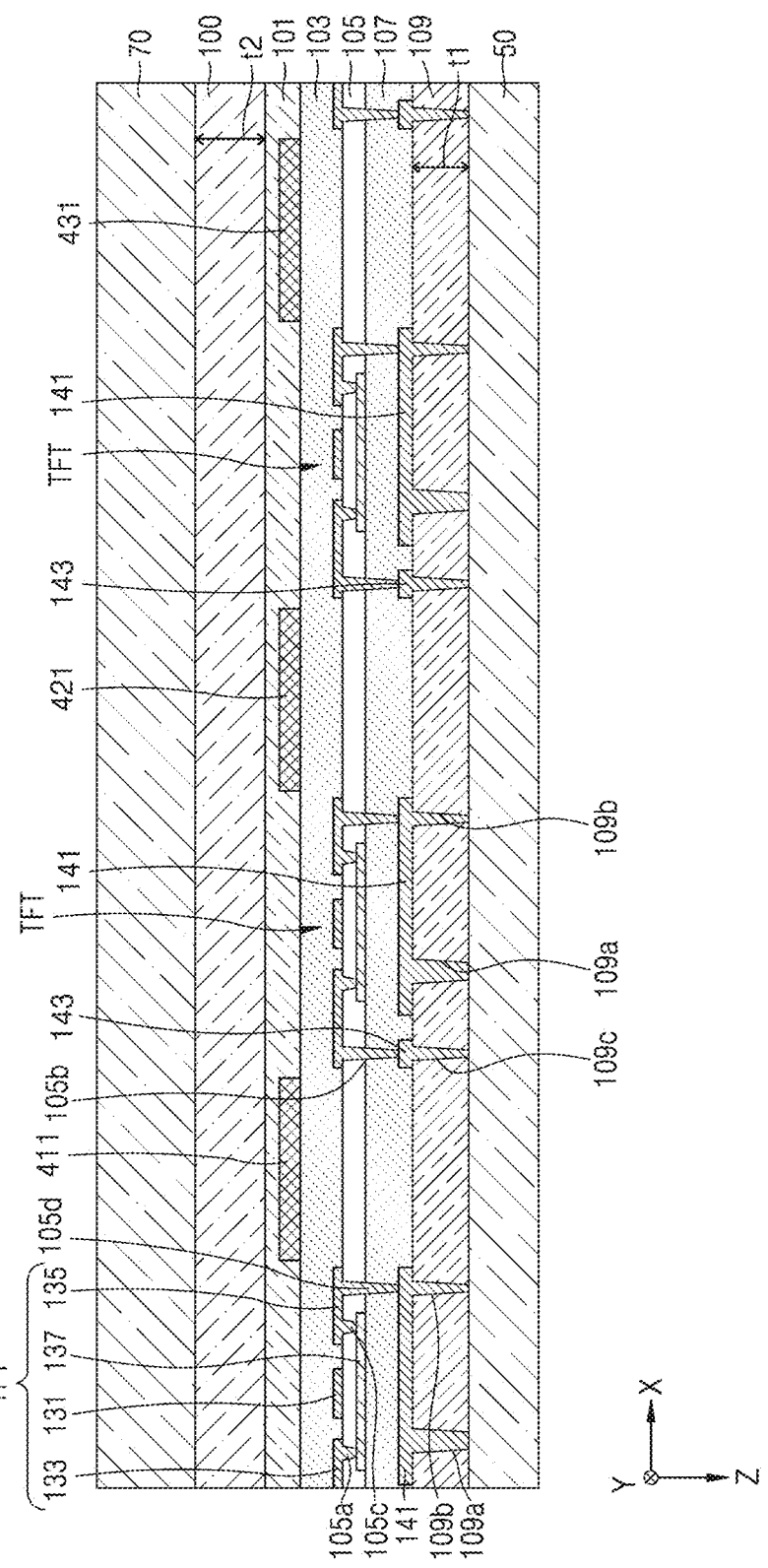

Thereafter, referring to FIG. 15, the second carrier substrate 70 may be formed on the overcoat layer 100. In an embodiment, the second carrier substrate 70 may be formed of or include glass.

In an embodiment, by applying a material forming the overcoat layer 100 on the second insulating layer 101 and curing the material forming the overcoat layer 100 after forming the second carrier substrate 70, the second carrier substrate 70 may be formed (or attached) on the overcoat layer 100.

Figure 16:
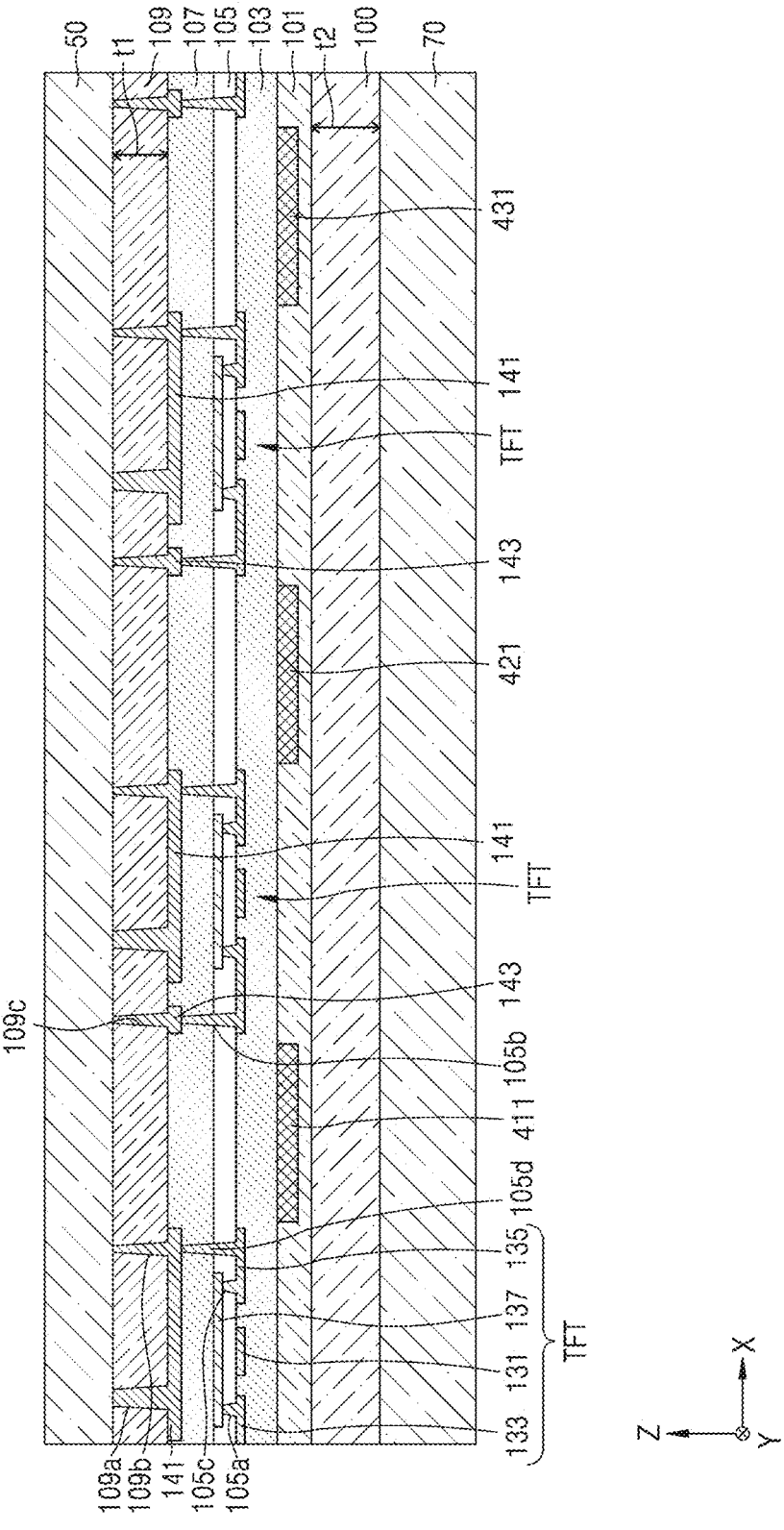

Thereafter, referring to FIG. 16, after the second carrier substrate 70 is formed on the overcoat layer 100, the first carrier substrate 50 may be inverted. In more detail, after the second carrier substrate 70 is formed on the first carrier substrate 50, the first carrier substrate 50 on which the second carrier substrate 70 is formed may be inverted (turned over). For example, a display apparatus in which the first carrier substrate 50, the first planarization layer 109, the buffer layer 107, the gate insulating layer 105, the first insulating layer 103, the second insulating layer 101, the overcoat layer 100, and the second carrier substrate 70 are sequentially stacked may be turned over so that the first carrier substrate 50 is arranged on the top.

Figure 17:
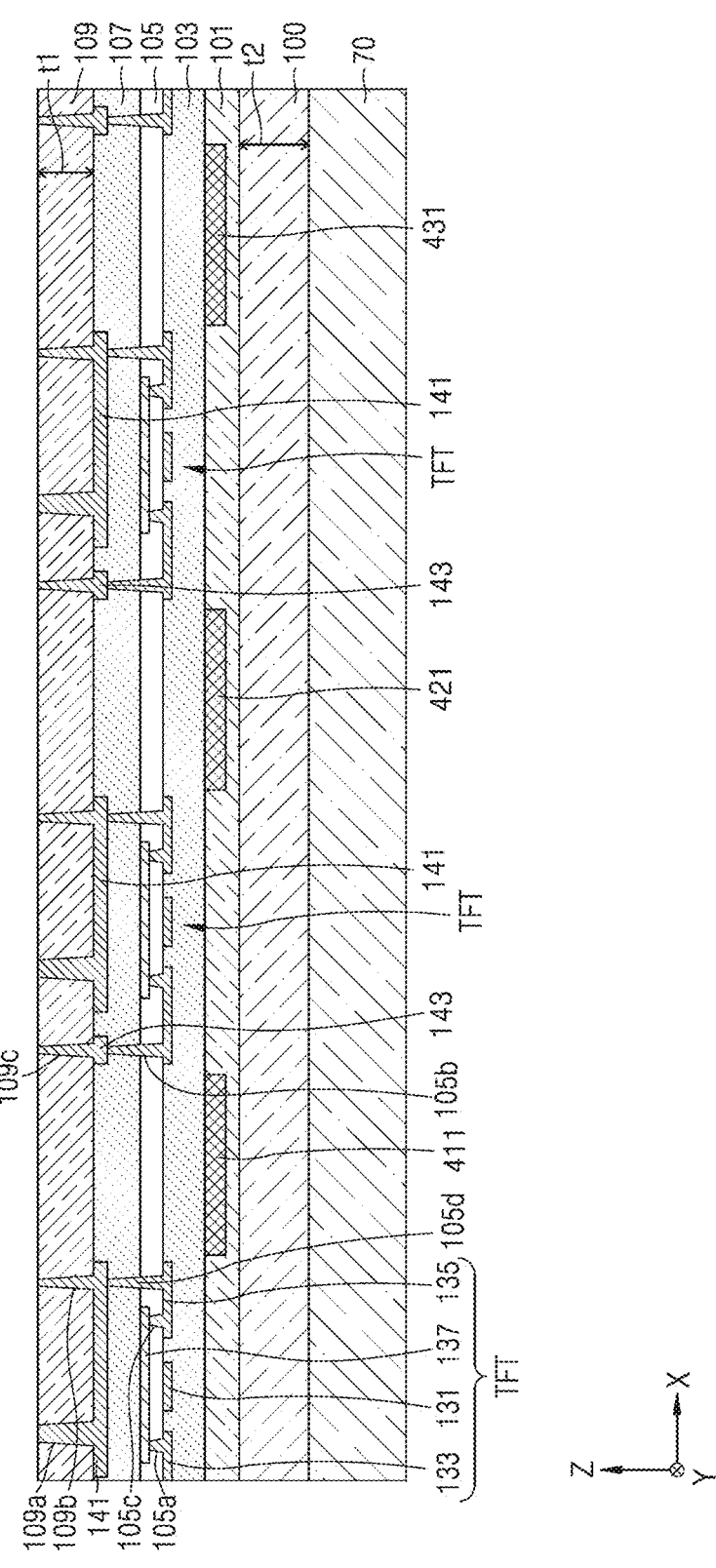

Thereafter, referring to FIG. 17, the first carrier substrate 50 may be detached (removed). In more detail, after inverting (turning over) the first carrier substrate 50, the first carrier substrate 50 positioned on the first planarization layer 109 may be detached (removed).

In an embodiment, the first carrier substrate 50 may be detached (removed) using a laser beam. However, the disclosure is not limited thereto.

Figure 18:
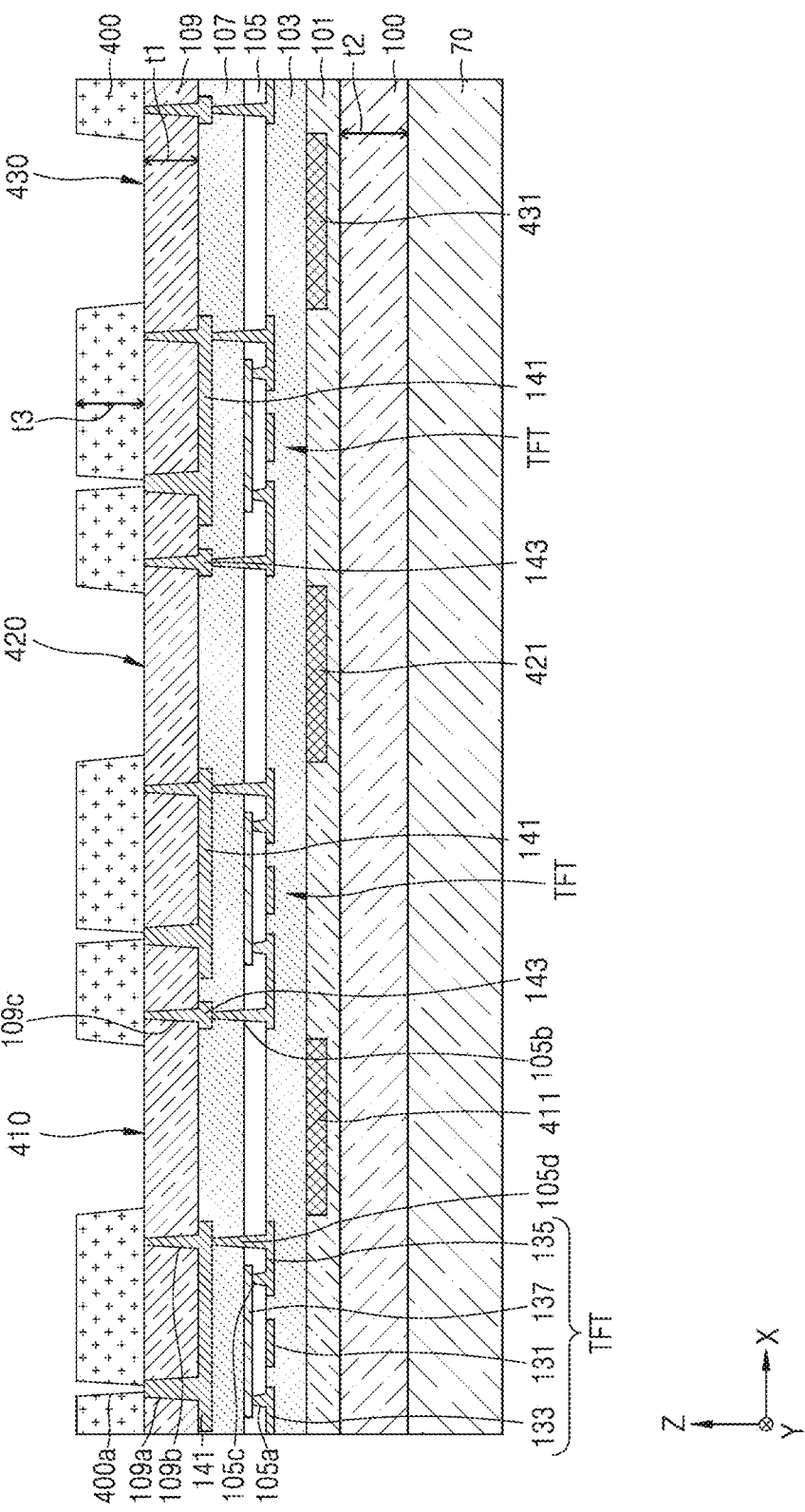

Thereafter, referring to FIG. 18, the second planarization layer 400 may be formed on the first planarization layer 109. In an embodiment, the second planarization layer 400 may be formed of or include a polymer resin. For example, the second planarization layer 400 may be formed of or include polyarylate, polyimide, or the like.

In an embodiment, the second planarization layer 400 may have a maximum thickness of about 10 μm to about 15 μm (e.g., the third thickness t3). In an embodiment, the second planarization layer 400 may be provided with a maximum thickness of about 10 μm to about 15 μm (e.g., the third thickness t3) from the upper surface (or one side) of the first planarization layer 109. Because the second planarization layer 400 is provided with a maximum thickness of about 10 μm to about 15 μm, luminous efficiency may be effectively improved, a high-resolution display apparatus may be realized, and the amount of material forming the quantum dot layers 413 and 423 may be effectively reduced.

In an embodiment, the second planarization layer 400 may define the first through-hole 410, the second through-hole 420, and the third through-hole 430 therein. In addition, the second planarization layer 400 may include the contact hole 400a. That is, the contact hole 400a may be defined in the second planarization layer 400.

Figure 19:
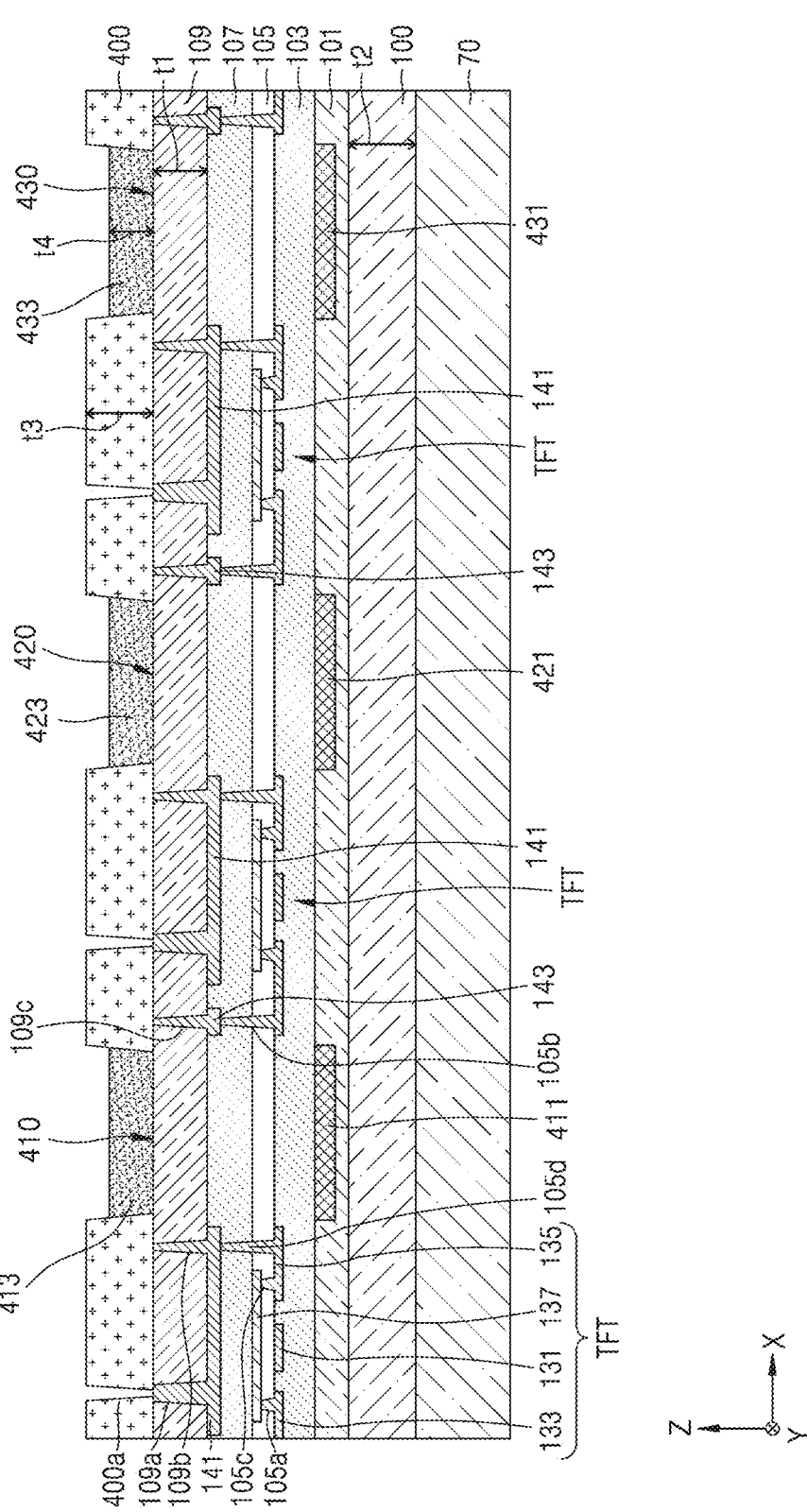

Thereafter, referring to FIG. 19, the first quantum dot layer 413, the second quantum dot layer 423, and the light-transmitting layer 433 may be formed on the transistor TFT. In more detail, the first quantum dot layer 413, the second quantum dot layer 423, and the light-transmitting layer 433 may be formed in the first through-hole 410, the second through-hole 420, and the third through-hole 430 provided in the second planarization layer 400, respectively.

In an embodiment, each of the first quantum dot layer 413 and the second quantum dot layer 423 may include quantum dots. In the specification, quantum dots refer to crystals of a semiconductor compound, and may include any material capable of emitting light in various wavelength bands according to the size of the crystals.

The quantum dots exhibit unique excitation and emission characteristics according to their material and size, and thus may convert incident light into certain color light. Various materials may be employed as the quantum dots. For example, the quantum dots may include a Group II-VI compound, a Group III-V compound, a Group III-VI compound, a Group semiconductor compound, a Group IV-VI semiconductor compound, a Group IV element or compound, or any combination thereof.

The Group II-VI compound may be selected from the group consisting of a binary compound selected from the group consisting of CdS, CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. However, a Group III-V semiconductor compound may further include a Group II element. Examples of the Group III-V semiconductor compound further including a Group II element may include InZnP, InGaZnP, InAlZnP, or the like.

Examples of a Group III-VI semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, $InGaSe_3$, and the like; or any combination thereof.

Examples of the Group semiconductor compound may include a ternary compound such as AgInS, $AgInS_2$, CuInS, $CuInS_2$, $CuGaO_2$, $AgGaO_2$, $AgAlO_2$, and the like, or any combination thereof.

The Group IV-VI compound may be selected from the group consisting of a binary compound selected from the group consisting of SnS, SnSe, SnTe, PbS, PbSe, PbTe and a mixture thereof; a ternary compound selected from the group consisting of SnSeS, SnSeTe, SnSTe, PbSeS, PbSeTe, PbSTe, SnPbS, SnPbSe, SnPbTe and a mixture thereof; and a quaternary compound selected from the group consisting of SnPbSSe, SnPbSeTe, SnPbSTe and a mixture thereof.

The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may exist in a particle with a uniform concentration, or may be in partially different concentration distributions in the same particle.

The quantum dots may be formed in a core-shell structure having a core and a shell. An interface between the core and the shell may have a concentration gradient in which the concentration of an element present in the shell decreases toward the center.

The shell of the quantum dots may serve as a protective layer for maintaining semiconductor properties by preventing chemical modification of the core and/or as a charging layer for imparting electrophoretic properties to the quantum dots. The shell may be a single layer or multiple layers. An interface between the core and the shell may have a concentration gradient in which the concentration of an element present in the shell decreases toward the center.

Examples of the shell of the quantum dots may include a metal, a metalloid or non-metal oxide, a semiconductor compound, or a combination thereof. Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, a ternary compound such as $MgAl_2O_4$, $CoFe_2O_4$, $NiFe_2O_4$, $CoMn_2O_4$, and the like, or any combination thereof. Examples of the semiconductor compound may include, as described herein, the Group III-VI semiconductor compound, the Group II-VI semiconductor compounds, the Group III-V semiconductor compound, the Group III-VI semiconductor compound, the Group I-III-VI semiconductor compound, the Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dots may have a size of about 45 nm or less, preferably about 40 nm or less, more preferably about 30 nm or less, and color purity or color reproducibility may be improved in this range. In addition, because light emitted through the quantum dots is emitted in all directions, a wide viewing angle may be improved.

In addition, the form of the quantum dots is not particularly limited as those generally used in the art, but more specifically spherical, pyramidal, multi-arm, or cubic nanoparticles, nanotubes, nanowires, nanofibers, nanoplatelets, etc. may be used.

The core of the quantum dots may be 2 nm to 10 nm in diameter, and the quantum dots may emit light of a specific frequency depending on the size of particles and the type of material when exposed to light, so that the average size of the quantum dots included in the first quantum dot layer 413 and the average size of the quantum dots included in the second quantum dot layer 423 may be different from each other. For example, the larger the quantum dot size, the longer-wavelength color may be emitted.

The first quantum dot layer 413 and the second quantum dot layer 423 may further include, in addition to quantum dots, various materials for mixing and properly dispersing them. For example, the first quantum dot layer 413 and the second quantum dot layer 423 may further include scattering particles, a solvent, a photoinitiator, a binder polymer, a dispersant, and the like.

In an embodiment, the light-transmitting layer 433 may be formed of or include an organic material capable of emitting incident light to the outside without wavelength conversion. For example, the light-transmitting layer 433 may include scattering particles for uniform color spread. In this case, the scattering particles may have a diameter in the range of about 200 nm to 400 nm. However, the disclosure is not limited thereto.

In an embodiment, because an inkjet printing method is used, the amount of wasted material for forming a quantum dot layer may be minimized.

In an embodiment, the first quantum dot layer 413 may at least partially overlap the first color filter layer 411, the second quantum dot layer 423 may at least partially overlap the second color filter layer 421, and the light-transmitting layer 433 may at least partially overlap the third color filter layer 431.

In an embodiment, each of the first quantum dot layer 413, the second quantum dot layer 423, and the light-transmitting layer 433 may be provided with a maximum thickness of 8 μm to 13 μm (e.g., the fourth thickness t4). In more detail, each of the first quantum dot layer 413, the second quantum dot layer 423, and the light-transmitting layer 433 may be provided with a maximum thickness of 8 μm to 13 μm (e.g., the fourth thickness t4) from the upper surface (or one side) of the first planarization layer 109. Because each of the first quantum dot layer 413, the second quantum dot layer 423, and the light-transmitting layer 433 is provided to have a maximum thickness of 8 μm to 13 μm (e.g., fourth thickness t4), luminous efficiency of the display apparatus may be improved, and a material forming a quantum dot layer may be effectively prevented from being wasted.

In an embodiment, after respectively forming the first quantum dot layer 413, the second quantum dot layer 423, and the light-transmitting layer 433 in the first through-hole 410, the second through-hole 420, and the third through-hole 430, the light-emitting device may be formed on the first quantum dot layer 413, the second quantum dot layer 423, and the light-transmitting layer 433. In an embodiment, the light-emitting device may include the pixel electrode 210, the intermediate layer 220, and the opposite electrode 230 sequentially stacked, and the intermediate layer 220 may include a light-emitting layer.

Figure 20:
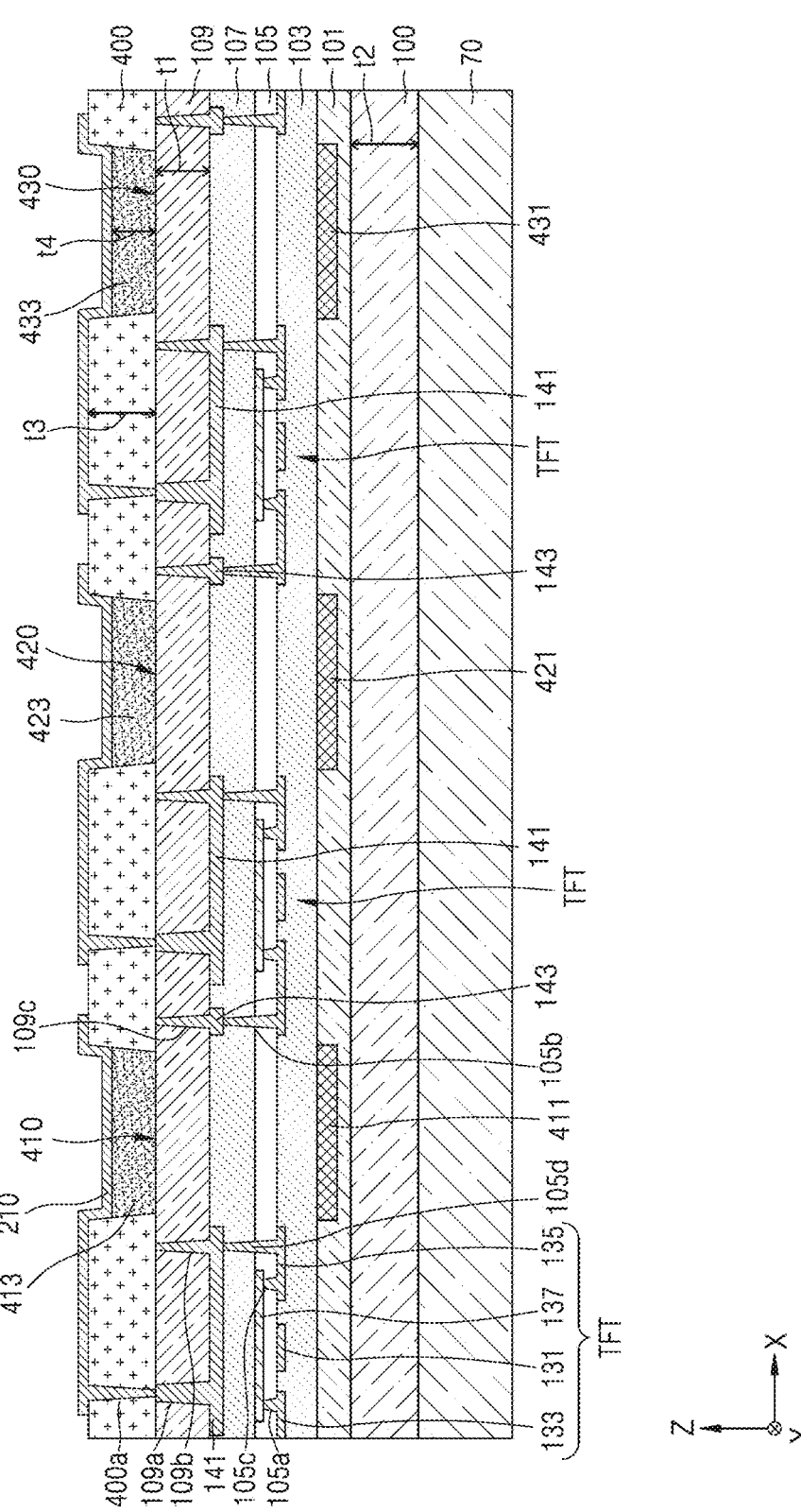

Referring to FIG. 20, the pixel electrode 210 may be formed on the first quantum dot layer 413, the second quantum dot layer 423, and the light-transmitting layer 433. In an embodiment, the pixel electrode 210 may be patterned to correspond to each of the pixels P1, P2, and P3 (see FIG. 2). In an embodiment, the pixel electrode 210 may be directly arranged on the first quantum dot layer 413, the second quantum dot layer 423, and the light-transmitting layer 433.

In an embodiment, in the pixel electrode 210, a transparent or semi-transparent electrode layer may include at least one selected from the group consisting of ITO, IZO, ZnO, $In_2O_3$, IGO, or AZO.

In an embodiment, the pixel electrode 210 may be electrically connected to the connection electrode 141 through the contact hole 400a defined in the second planarization layer 400. Accordingly, the light-emitting device may be electrically connected to the transistor TFT.

Figure 21:
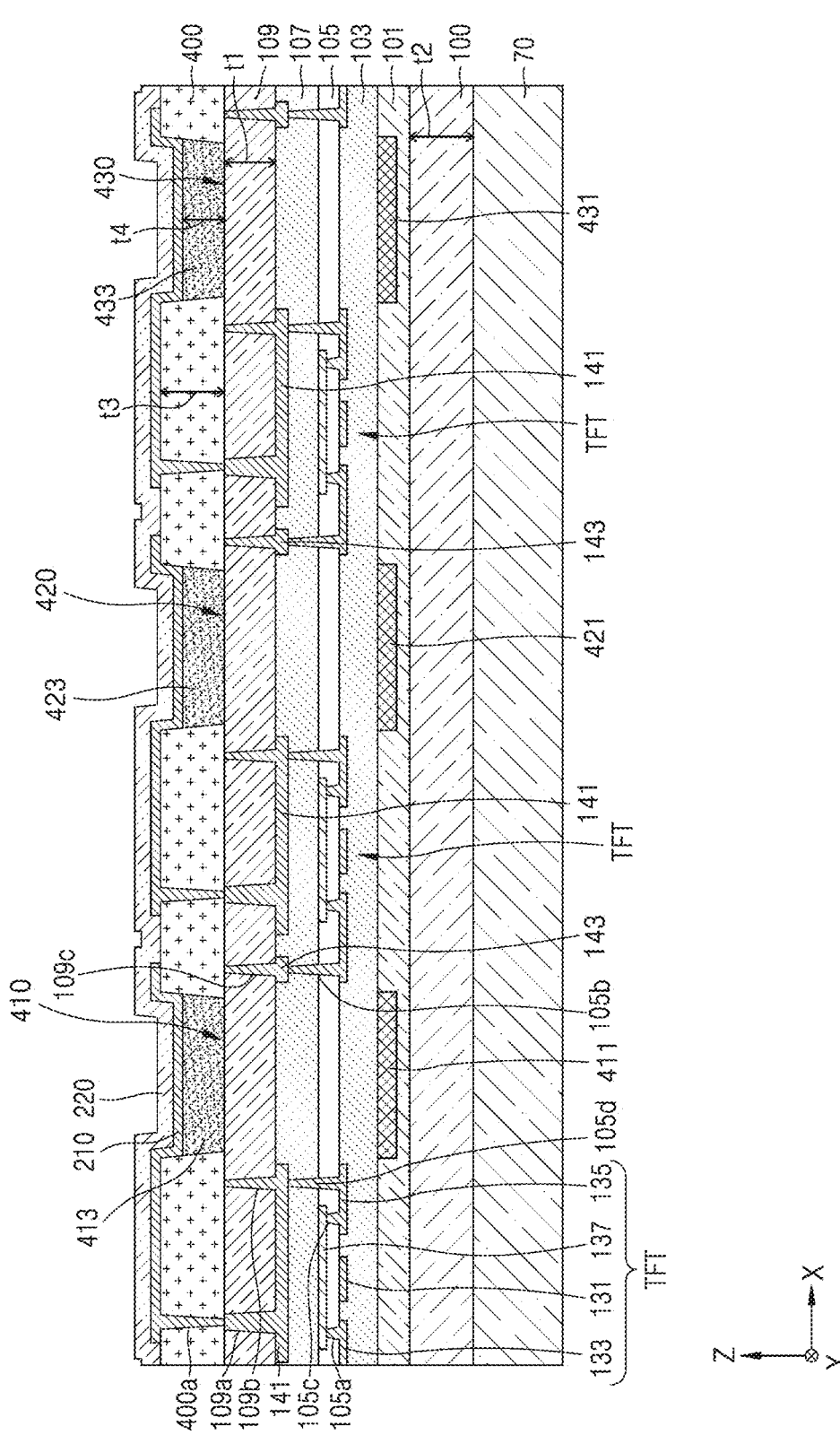

Thereafter, referring to FIG. 21, the intermediate layer 220 may be formed on the pixel electrode 210. In an embodiment, the intermediate layer 220 including at least one light-emitting layer may be formed on the pixel electrode 210.

In an embodiment, the light-emitting layer may include an organic light-emitting material such as a high molecular weight organic material or a low molecular weight organic material that emits light of a certain color. For example, the light-emitting layer may be formed of or include an organic material emitting blue light. However, the disclosure is not limited thereto. In an embodiment, the light-emitting layer may be formed of or include an organic material emitting red or green light, or may be formed of or include an inorganic light-emitting material or quantum dots.

In an embodiment, the intermediate layer 220 including at least one light-emitting layer may be provided integrally in light-emitting devices. However, the disclosure is not limited thereto.

Figure 22:
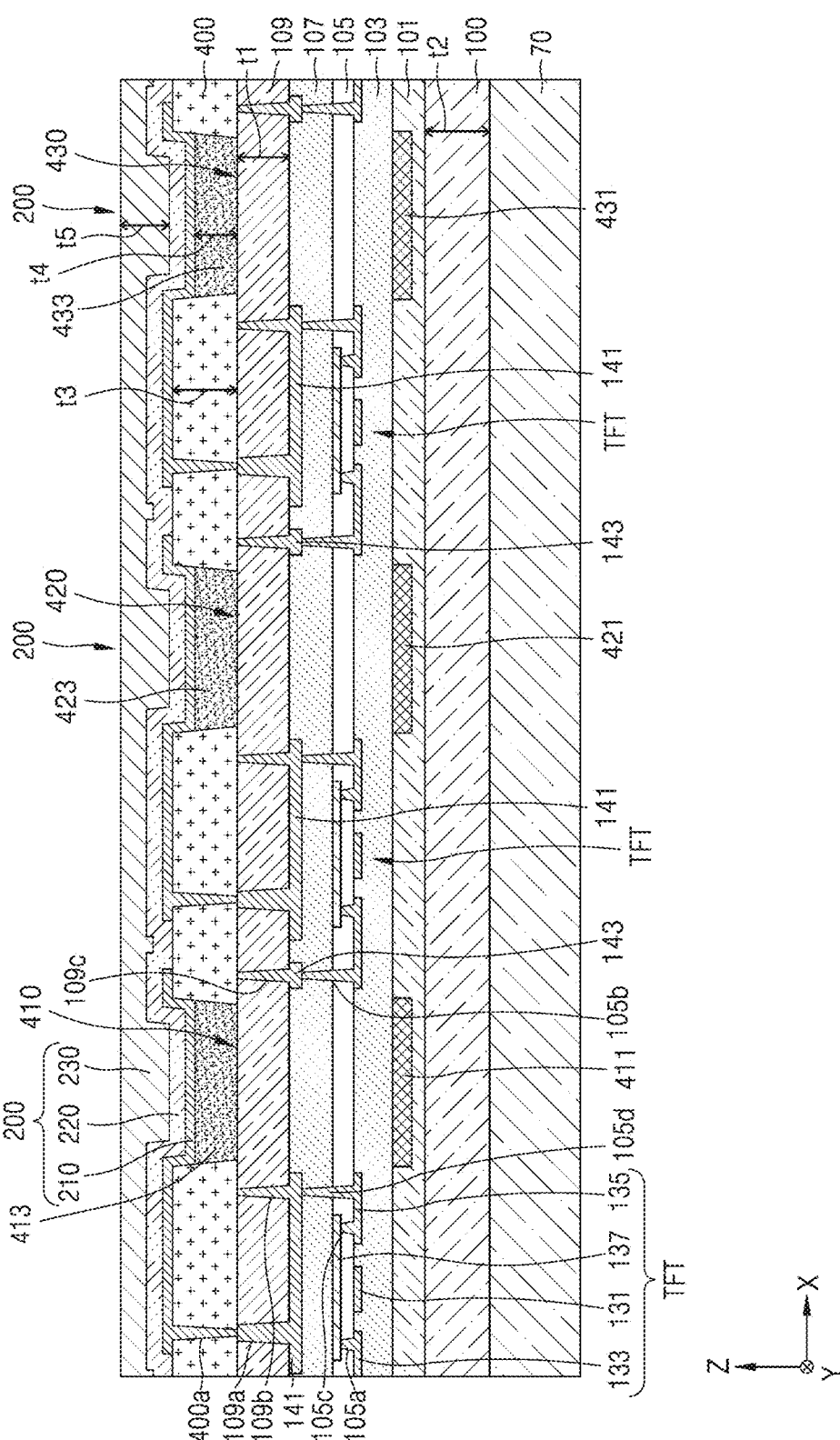

Thereafter, referring to FIG. 22, the opposite electrode 230 may be formed. In an embodiment, the opposite electrode 230 may be formed on the intermediate layer 220. In an embodiment, the opposite electrode 230 may be integrally formed in light-emitting devices. In an embodiment, the opposite electrode 230 may be a reflective electrode. For example, the opposite electrode 230 may include a reflective film formed of or include Al, Pt, Pd, Ag, Mg, Au, Ni, Nd, Ir, Cr, Li, Ca, Mo, Ti, W, Cu, or a compound thereof.

In an embodiment, the opposite electrode 230 may have a maximum thickness of 1000 angstroms (Å) or more (e.g., a fifth thickness t5). If the thickness of the opposing electrode 230 is less than 1000 angstroms (Å), the resistance of the opposing electrode 230 may increase, thereby reducing light-emitting efficiency.

In an embodiment, because the pixel electrode 210 arranged under the intermediate layer 220 including a light-emitting layer is formed as a transparent or translucent electrode, and the opposite electrode 230 arranged on the intermediate layer 220 is formed as a reflective electrode, a display apparatus including the same may be a bottom emission type in which light emitted from the light-emitting layer of the light-emitting device 200 is emitted toward the overcoat layer 100.

Figure 23:
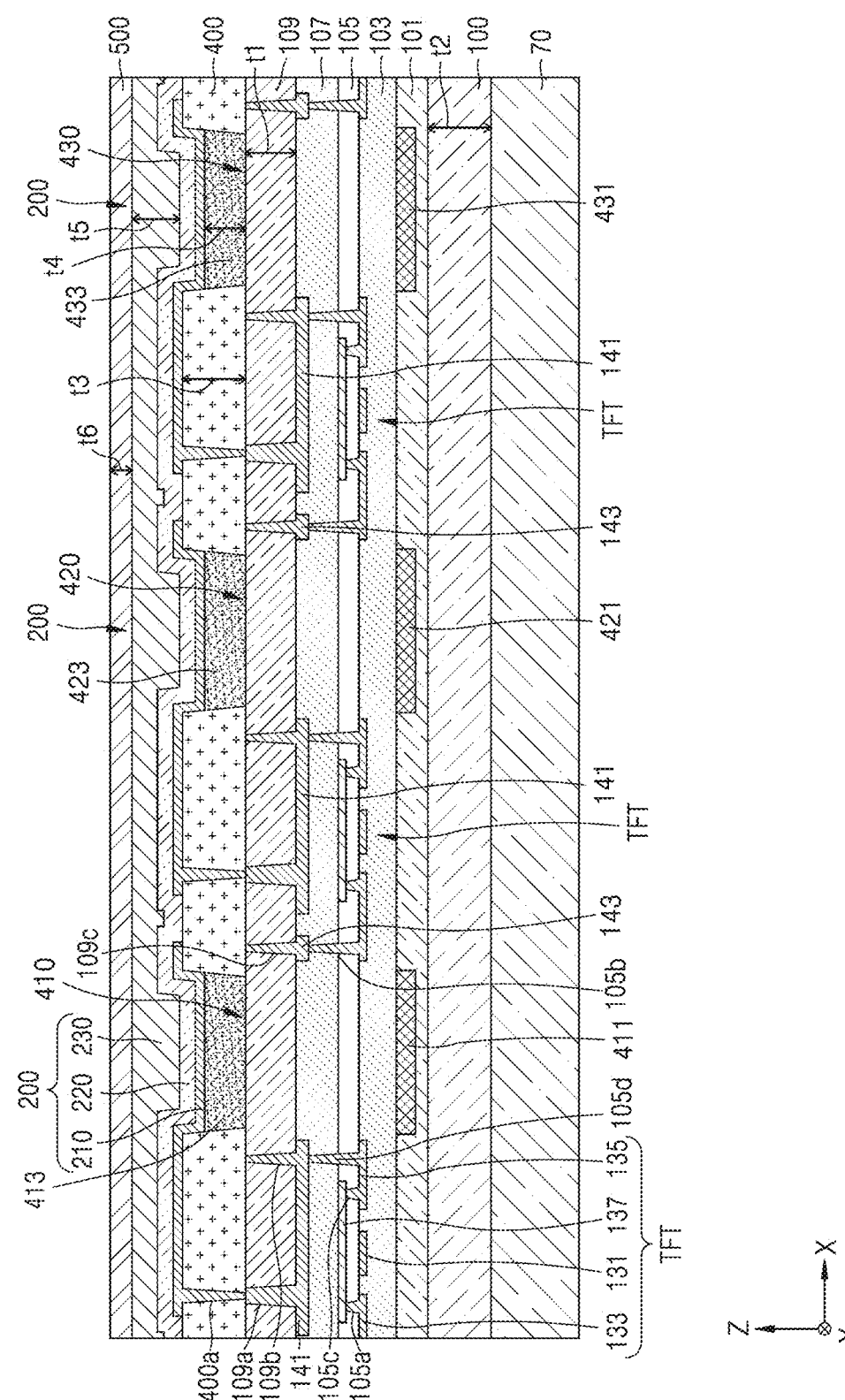

Thereafter, referring to FIG. 23, the encapsulation member 500 may be formed on the light-emitting device 200. In an embodiment, the encapsulation member 500 may be formed of or include a Fe—Ni alloy. In an embodiment, the encapsulation member 500 may be attached on the opposite electrode 230.

In an embodiment, the encapsulation member 500 may have a thickness of 50 μm to 150 μm (e.g., the sixth thickness t6). Because the encapsulation member 500 is provided with a thickness of 50 μm to 150 μm (e.g., the sixth thickness t6), it is possible to effectively prevent or minimize contamination of the light-emitting device 200 from external foreign matter, and at the same time to implement a flexible or bendable display apparatus.

Figure 24:
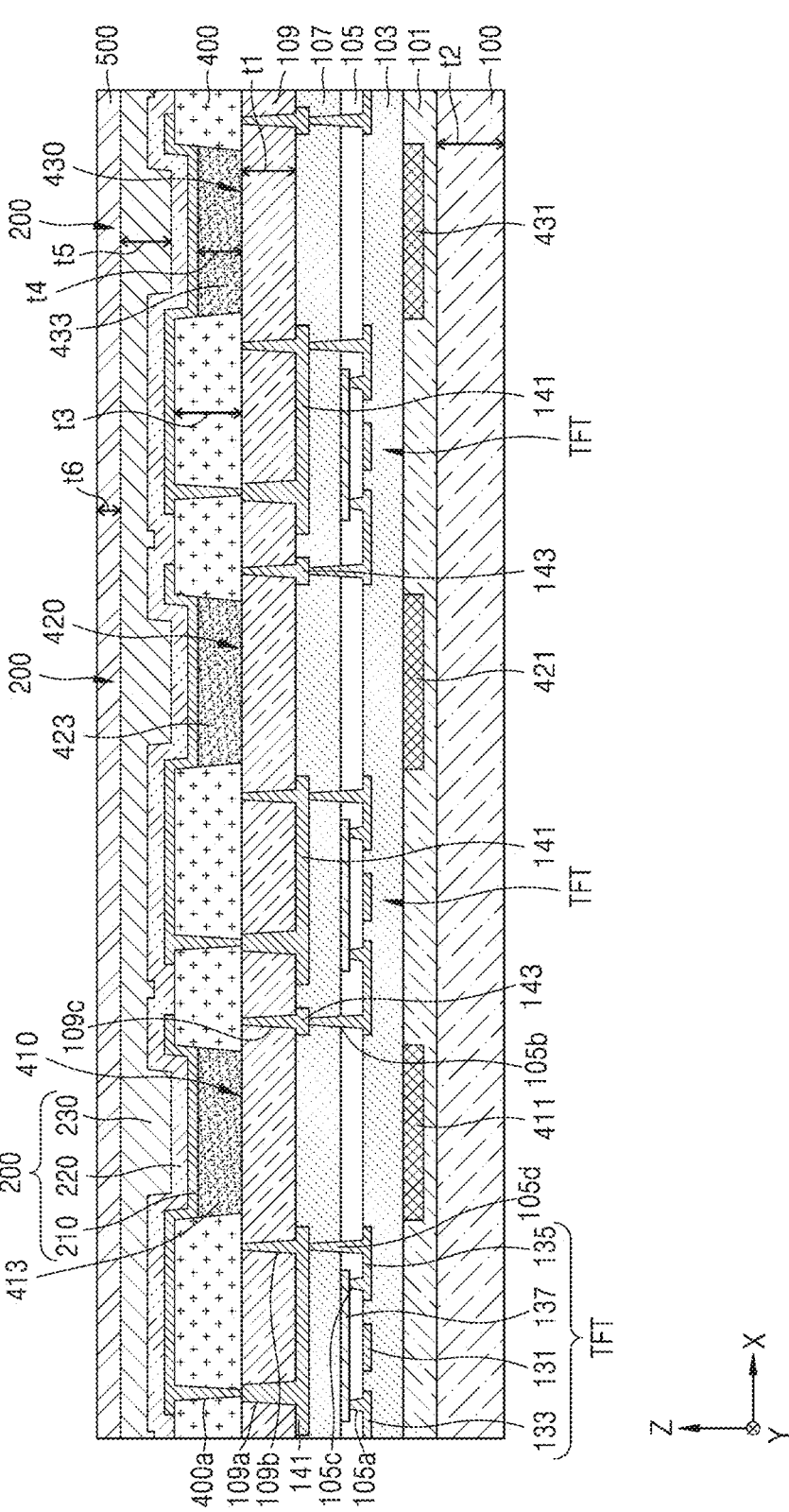

Thereafter, referring to FIG. 24, the second carrier substrate 70 may be detached (removed). In an embodiment, after the second planarization layer 400, the light-emitting device 200, and the encapsulation member 500 are sequentially formed on the first planarization layer 109, the second carrier substrate 70 under the overcoat layer 100 may be detached (removed). In an embodiment, the second carrier substrate 70 may be detached (removed) using a laser beam. However, the disclosure is not limited thereto.

The first carrier substrate 50 and the second carrier substrate 70 may be formed of or include glass. The first carrier substrate 50 and the second carrier substrate 70 are used to support components arranged thereon, and when the display apparatus includes the first carrier substrate 50 and/or the second carrier substrate 70 made of glass, bendability of the display apparatus may be reduced. For example, flexible or bendable characteristics of the display apparatus may be deteriorated.

In the disclosure, the bendability of the display apparatus may be improved by using the first carrier substrate 50 and/or the second carrier substrate 70 made of glass during a manufacturing process of the display apparatus, but later detaching (removing) the first carrier substrate 50 and the second carrier substrate 70 from the display apparatus. For example, the flexible or bendable characteristics of the display apparatus may be deteriorated.

Figure 25:
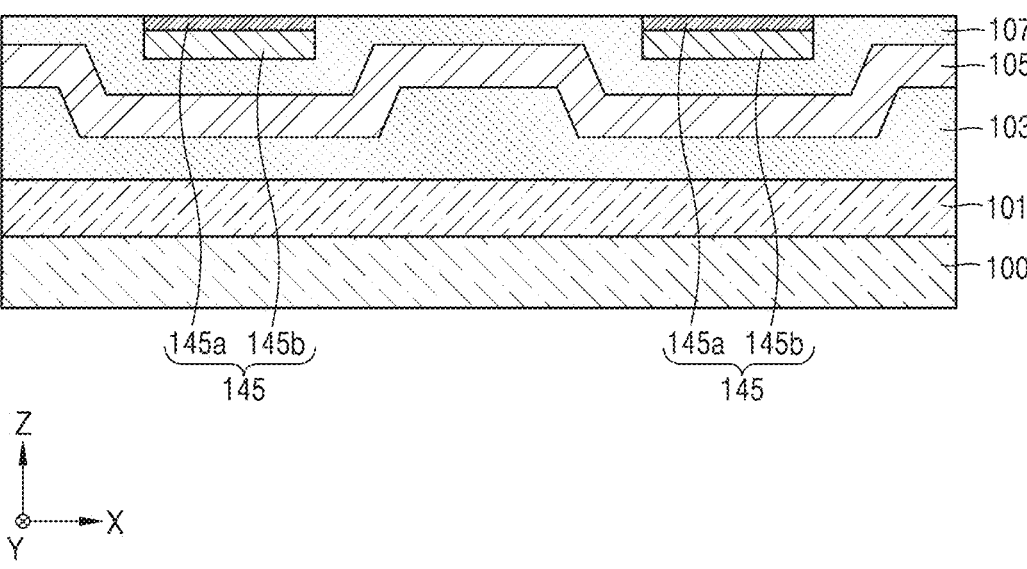
FIG. 25 is a cross-sectional view of a portion of a display apparatus according to an embodiment.

FIG. 25 is a cross-sectional view schematically illustrating a portion of a display apparatus according to an embodiment. FIG. 25 is a cross-sectional view illustrating a cross-section of a pad unit PAD provided on the peripheral area PA.

Referring to FIG. 25, the second insulating layer 101, the first insulating layer 103, the gate insulating layer 105, and the buffer layer 107 may be sequentially arranged on the overcoat layer 100. In an embodiment, the pad electrode 145 may be arranged on the buffer layer 107. In an embodiment, the pad electrode 145 may be arranged on the same layer as that of the connection electrode 141 and the light-shielding electrode 143 described above in FIG. 2.

In an embodiment, the pad electrode 145 may be a single layer or multiple layers of at least one of Al, Pt, Pd, Ag, Mg, Au, Ni, Nd, Ir, Cr, Li, Ca, Mo, Ti, W, and Cu. Alternatively, the pad electrode 145 may include at least one selected from the group consisting of ITO, IZO, ZnO, $In_2O_3$, IGO, or AZO.

In an embodiment, the pad electrode 145 may include a first conductive layer 145a and a second conductive layer 145b. In an embodiment, the first conductive layer 145a may be arranged on the second conductive layer 145b. In an embodiment, the first conductive layer 145a may be made of Ti or ITO, and the second conductive layer 145b may be made of Cu.

The pad electrode 145 will be described in more detail with reference to FIGS. 26 to 32.

FIGS. 26 to 32 are cross-sectional views schematically illustrating a process of manufacturing a portion of the display apparatus 1 according to an embodiment. In more detail, FIGS. 26 to 32 are cross-sectional views schematically illustrating a manufacturing process of the display apparatus 1 of FIG. 25.

Figure 26:
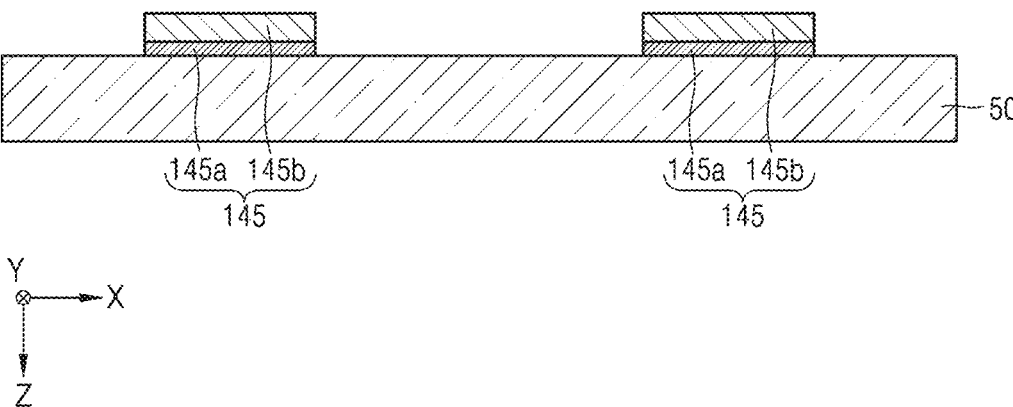
FIGS. 26 to 32 are cross-sectional views illustrating a process of manufacturing a portion of a display apparatus according to an embodiment.

Referring to FIG. 26, the pad electrode 145 may be formed on the first carrier substrate 50. In an embodiment, the pad electrode 145 may include the first conductive layer 145a and the second conductive layer 145b. In an embodiment, after the first conductive layer 145a is formed on the first carrier substrate 50, the second conductive layer 145b may be formed on the first conductive layer 145a.

In an embodiment, the first conductive layer 145a and the second conductive layer 145b may be formed of or include different materials. For example, the first conductive layer 145a may be made of Ti or ITO, and the second conductive layer 145b may be made of Cu. In an embodiment, the first conductive layer 145a may be provided to protect the second conductive layer 145b. In more detail, the first conductive layer 145a may effectively prevent the second conductive layer 145b from being damaged in a subsequent process, and may effectively prevent the second conductive layer 145b from being combined with a component arranged thereunder to form an oxide.

The first conductive layer 145a of the pad electrode 145 may have a thickness of 200 angstroms (Å) to 300 angstroms (Å). If the thickness of the first conductive layer 145a is less than 200 angstroms (Å), the thickness of the first conductive layer 145a is too thin to protect the second conductive layer 145b through the first conductive layer 145a, so that the second conductive layer 145b may be damaged in a subsequent process or may combine with the surrounding components to form an oxide. On the other hand, if the thickness of the second conductive layer 145b exceeds 300 angstroms (Å), it may be difficult to pattern the second conductive layer 145b. For example, although the second conductive layer 145b is etched by a wet etching process, when the first conductive layer 145a exceeds 300 angstroms (Å), the second conductive layer 145b may not be well etched. Accordingly, when the first conductive layer 145a has a thickness of 200 angstroms (Å) to 300 angstroms (Å), the second conductive layer 145b may be protected by the first conductive layer 145a and may be easily formed on the first conductive layer 145a.

The second conductive layer 145b of the pad electrode 145 may have a thickness of 5000 angstroms (Å) to 6000 angstroms (Å). If the thickness of the second conductive layer 145b is less than 5000 angstroms (Å), the total thickness of the pad electrode 145 may decrease, and thus the total resistance of the pad electrode 145 may increase. On the other hand, if the thickness of the second conductive layer 145b is greater than 6000 angstroms (Å), cracks may occur in the surrounding inorganic layer, and stress due to the thickness may increase. Accordingly, when the second conductive layer 145b is provided with a thickness of 5000 angstroms (Å) to 6000 angstroms (Å), it is possible to increase the total thickness of the pad electrode 145 and reduce the total resistance of the pad electrode 145, to effectively prevent or minimize the occurrence of cracks in the surrounding inorganic layer, and to effectively prevent or minimize an increase in stress due to the thickness.

Figure 27:
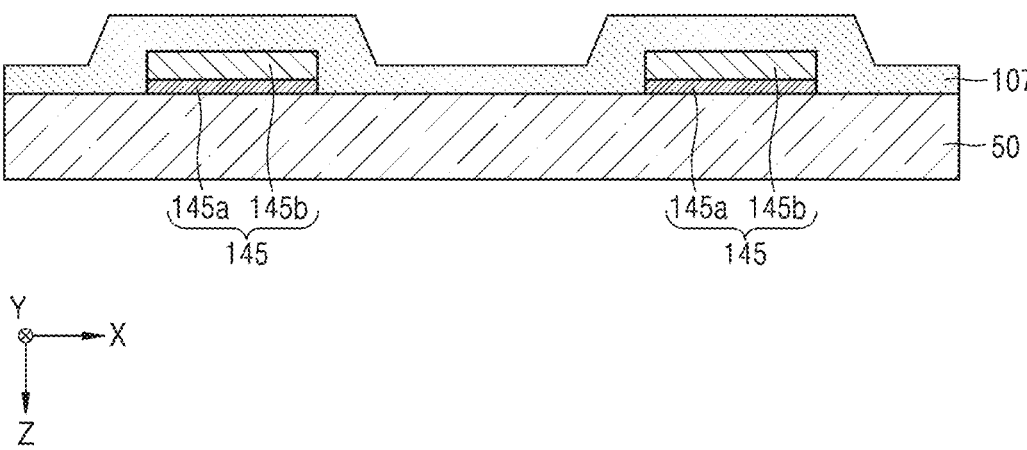

Thereafter, referring to FIG. 27, the buffer layer 107 may be formed on the pad electrode 145. In an embodiment, the buffer layer 107 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the buffer layer 107 may be provided as a single layer or multiple layers including the above-described inorganic insulating material.

Figure 28:
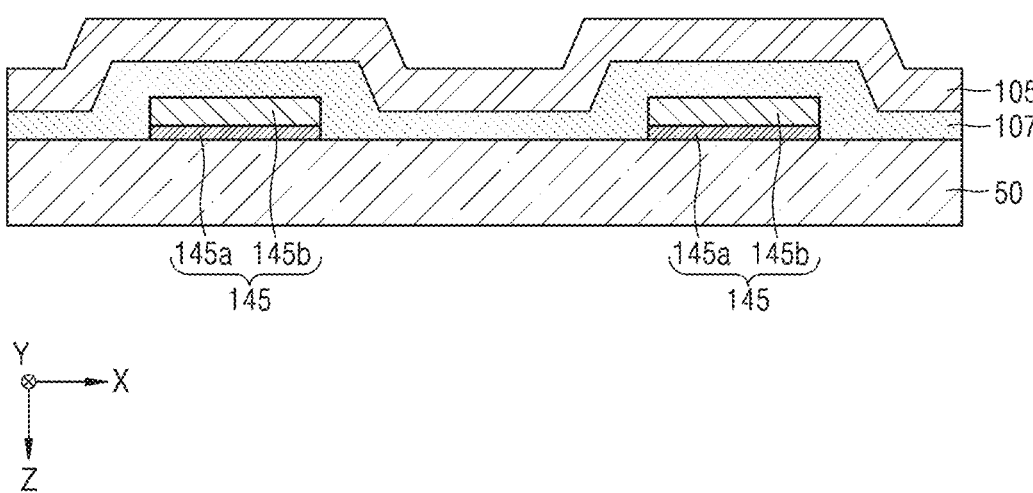

Referring to FIG. 28, the gate insulating layer 105 may be formed on the buffer layer 107. In an embodiment, the gate insulating layer 105 may include at least one inorganic insulating material selected from the group containing $SiO_X$, $SiN_X$, $SiO_XN_Y$, $Al_2O_3$, $TiO_2$, $Ta_2O_5$, $HfO_2$, or ZnO. In an embodiment, the gate insulating layer 105 may be provided as a single layer or multiple layers including the above-described inorganic insulating material.

Figure 29:
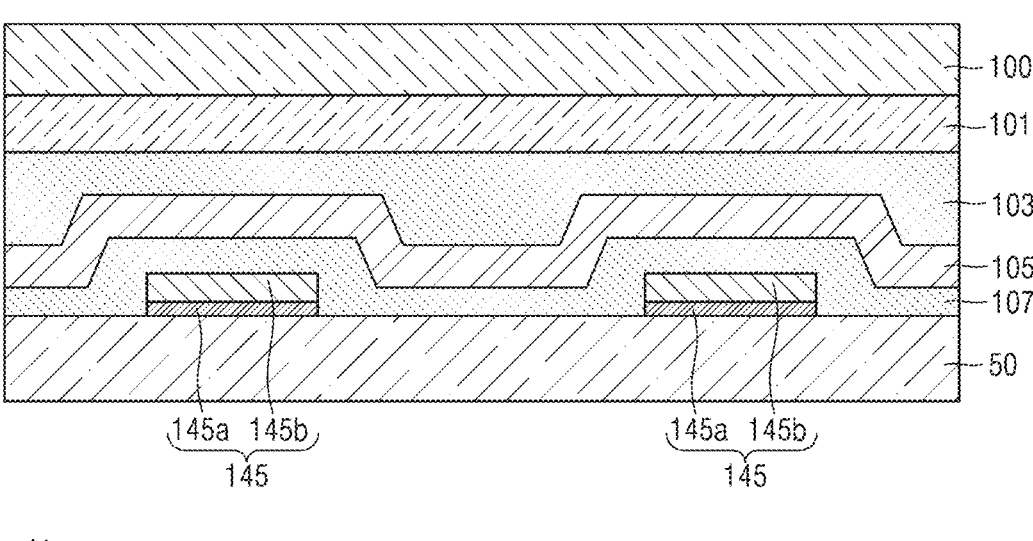
Figure 29:
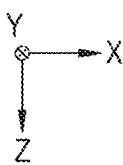

Thereafter, referring to FIG. 29, the first insulating layer 103, the second insulating layer 101, and the overcoat layer 100 may be sequentially formed on the gate insulating layer 105. In an embodiment, the first insulating layer 103 and the second insulating layer 101 may be formed of or include a polymer resin. In an embodiment, the overcoat layer 100 may be formed of or include a polymer resin. For example, the overcoat layer 100 may be formed of or include polyarylate, polyimide, or the like.

Figure 30:
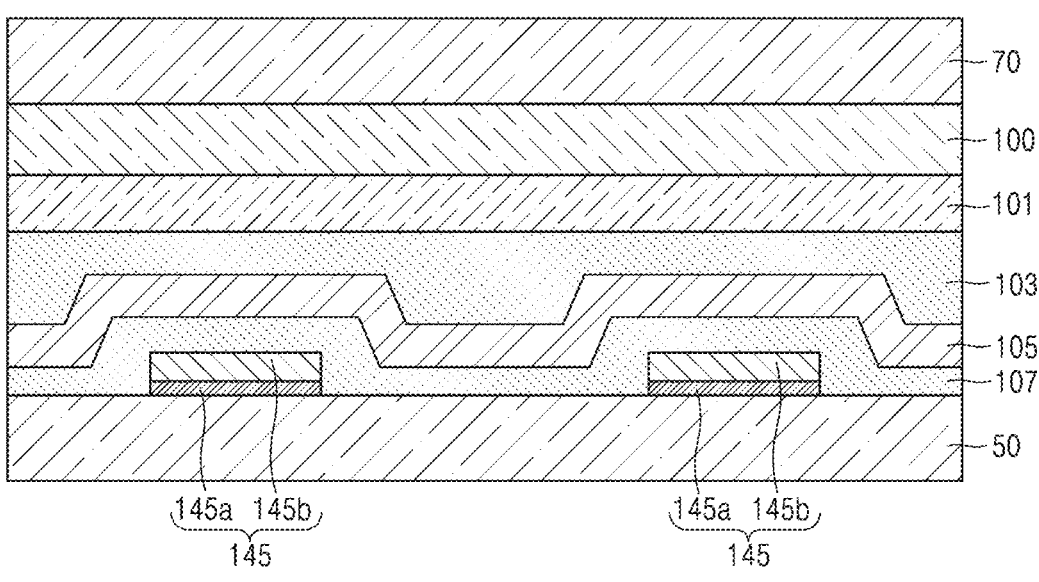
Figure 30:
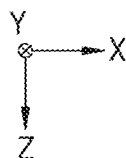

Thereafter, referring to FIG. 30, the second carrier substrate 70 may be formed on the overcoat layer 100. In an embodiment, the second carrier substrate 70 may be formed of or include glass.

In an embodiment, by applying a material forming the overcoat layer 100 on the second insulating layer 101 and curing the material forming the overcoat layer 100 after forming the second carrier substrate 70, the second carrier substrate 70 may be formed on the overcoat layer 100.

Figure 31:
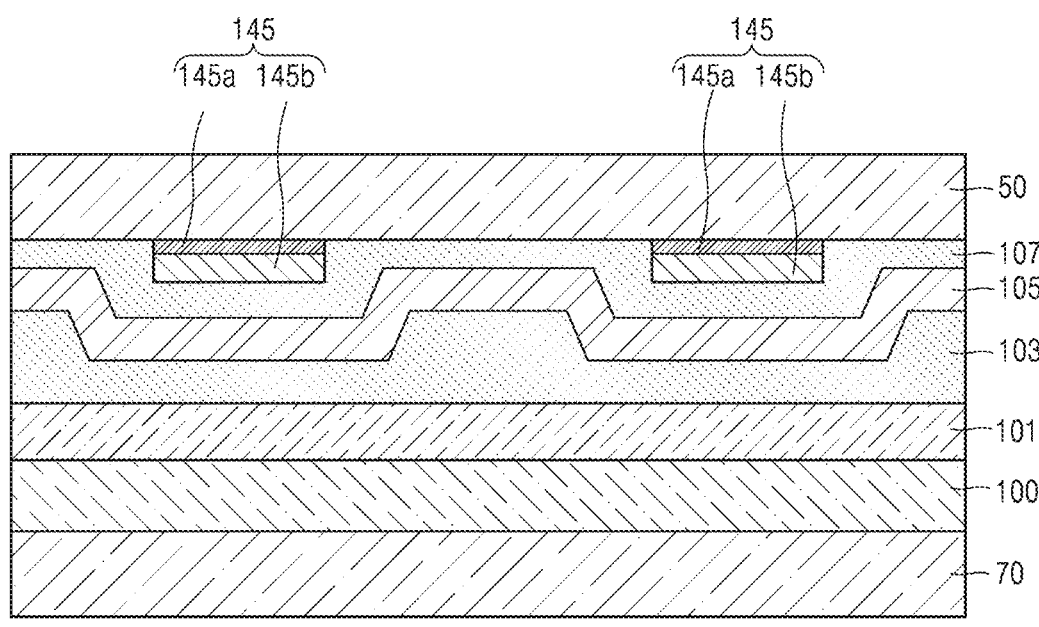
Figure 31:
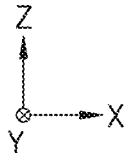

Thereafter, referring to FIG. 31, after the second carrier substrate 70 is formed on the overcoat layer 100, the first carrier substrate 50 may be inverted. In more detail, after the second carrier substrate 70 is formed on the first carrier substrate 50, inverting the first carrier substrate 50 on which the second carrier substrate 70 is formed may be performed. For example, a display apparatus in which the first carrier substrate 50, the buffer layer 107, the gate insulating layer 105, the first insulating layer 103, the second insulating layer 101, the overcoat layer 100, and the second carrier substrate 70 are sequentially stacked may be turned over so that the first carrier substrate 50 is arranged on the top.

Figure 32:
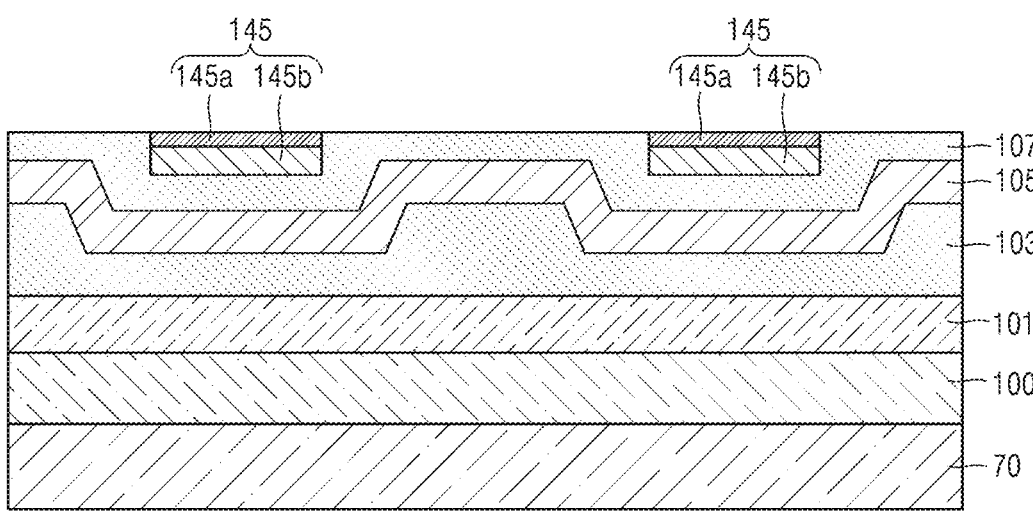
Figure 32:
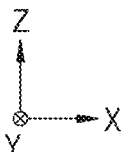

Thereafter, referring to FIG. 32, detaching (removing) the second carrier substrate 70 may be performed. In more detail, after inverting (turning over) the first carrier substrate 50, detaching (removing) the first carrier substrate 50 positioned on the first planarization layer 109 may be performed.

In an embodiment, the first carrier substrate 50 may be detached (removed) using a laser beam. However, the disclosure is not limited thereto.

In an embodiment, because the first carrier substrate 50 is detached (removed), the pad electrode 145 may be exposed to the outside. In more detail, because the first carrier substrate 50 is detached (removed), the first conductive layer 145a of the pad electrode 145 may be exposed to the outside.

When Cu is directly formed on an inorganic layer, Cu and the inorganic layer are combined to form an oxide, which may deteriorate insulating properties of the inorganic layer. In addition, when Cu is directly formed on the inorganic layer, a deposition rate may be lower than when Cu is formed on Ti. Accordingly, when an electrode is manufactured by forming Ti on the inorganic film and then forming Cu on Ti, it is possible to effectively prevent or minimize the formation of oxides by combining Cu with the inorganic layer, and it is possible to improve a deposition rate of a Cu electrode.

However, when the pad electrode 145 has a structure in which Ti and Cu are sequentially stacked, in a subsequent wet etching process, the outermost exposed Cu may be damaged. To effectively prevent this, when the pad electrode 145 has a structure in which Ti, Cu, and ITO are sequentially stacked, in the process of etching the ITO, a tip may be generated in the ITO, thereby causing cracks in inorganic layers arranged on the pad electrode 145. In addition, in order to effectively prevent this, when the pad electrode 145 has a structure in which Ti, Cu, Ti, and ITO are sequentially stacked, a process for etching Ti and ITO may be added.

In the display apparatus according to an embodiment, the first conductive layer 145a made of Ti is first formed on the first carrier substrate 50, and the second conductive layer 145b made of Cu is formed on the first conductive layer 145a, so that the bonding of Cu and the inorganic layer to form an oxide may be effectively prevented or minimized, and the deposition rate of the Cu electrode may be improved.

In addition, by sequentially stacking the first conductive layer 145a and the second conductive layer 145b on the first carrier substrate 50 and then inverting the first carrier substrate 50 on which the first conductive layer 145a and the second conductive layer 145b are arranged, the first conductive layer 145a may be above the second conductive layer 145b. For example, the display apparatus may have a structure in which the second conductive layer 145b, the first conductive layer 145a, and the first carrier substrate 50 are sequentially stacked.

Thereafter, when the first carrier substrate 50 on the first conductive layer 145a is removed, an upper surface of the first conductive layer 145a may be exposed to the outside. Accordingly, because the upper surface of the first conductive layer 145a made of Ti is exposed to the outside, and second conductive layer 145b made of Cu is not exposed to the outside, damage to the second conductive layer 145b made of Cu in a subsequent process may be effectively prevented or minimized.

In an embodiment, the pad electrode 145 may include the first conductive layer 145a including Ti and the second conductive layer 145b including Cu. For example, even when the pad electrode 145 is provided with the first conductive layer 145a including Ti and the second conductive layer 145b including Cu, by inverting the first carrier substrate 50 on which the first conductive layer 145a and the second conductive layer 145b is formed after sequentially forming the first conductive layer 145a including Ti and the second conductive layer 145b including Cu on the first carrier substrate 50, the first conductive layer 145a including Ti is positioned on the second conductive layer 145b including Cu, and thus oxidation or corrosion of the second conductive layer 145b made of Cu in a subsequent wet etching process may be effectively prevented or minimized.

Figure 33:
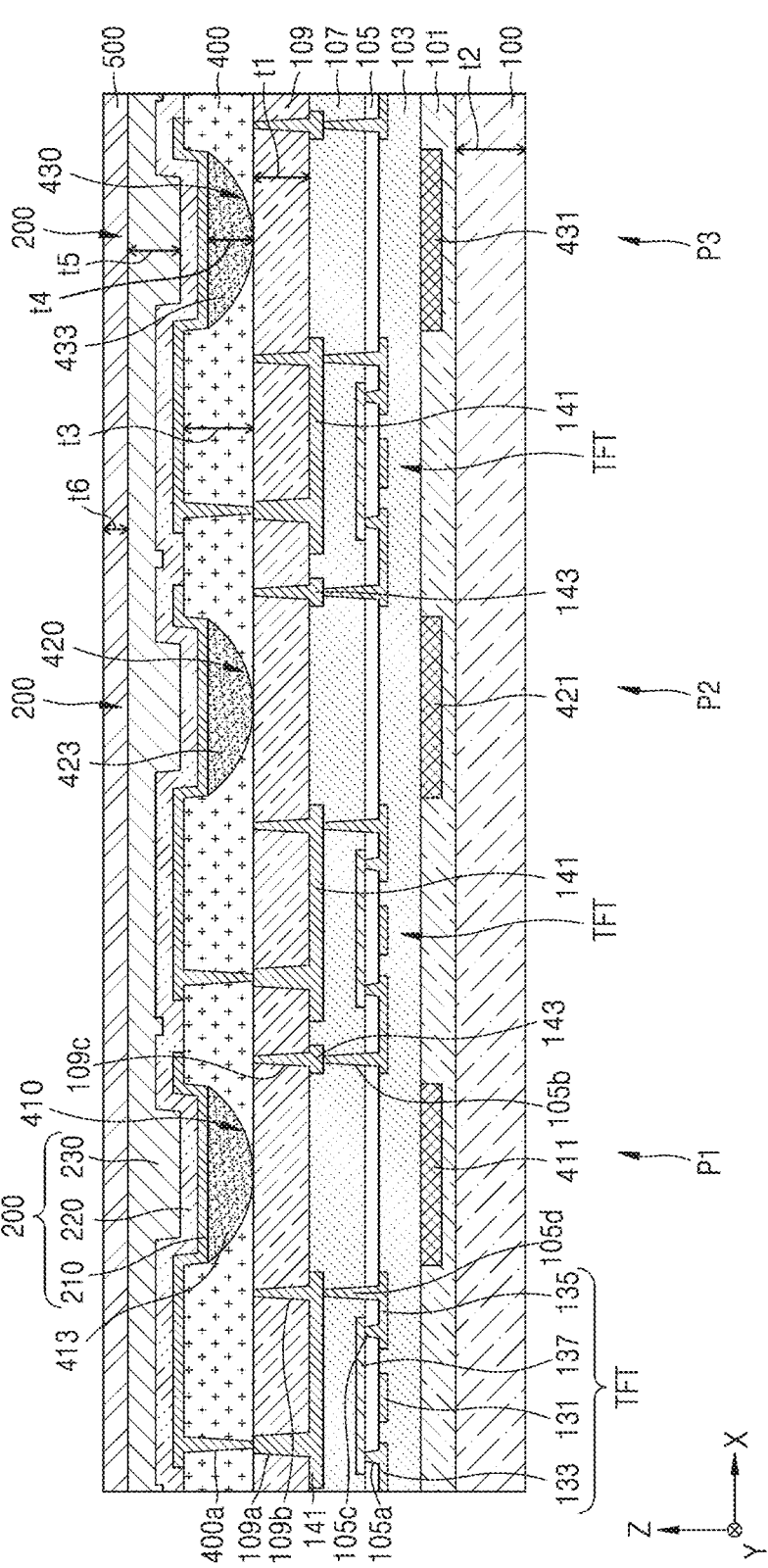
FIG. 33 is a cross-sectional view of a portion of a display apparatus according to another embodiment.

FIG. 33 is a cross-sectional view of a portion of a display apparatus according to another embodiment. The embodiment of FIG. 33 is different from the embodiment of FIG. 2 in that bottom surfaces of the first through-holes 410 to 430 are convex downward in a −Z direction. In FIG. 33, the same reference numerals as in FIG. 2 refer to the same members, and redundant descriptions thereof will be omitted.

Referring to FIG. 33, in an embodiment, the second planarization layer 400 may include the first through-hole 410, the second through-hole 420, and the third through-hole 430. In an embodiment, the bottom surfaces of the first through-hole 410, the second through-hole 420, and the third through-hole 430 provided in the second planarization layer 400 may have a convex shape in a direction approaching the overcoat layer 100. In more detail, the bottom surfaces of the first through-hole 410, the second through-hole 420, and the third through-hole 430 provided in the second planarization layer 400 may have a convex shape downward in the −Z direction. For example, the bottom surfaces of the first through-hole 410, the second through-hole 420, and the third through-hole 430 may be provided in a convex lens shape.

Because light generated from the light-emitting device is extracted through the overcoat layer 100 due to the convex lens-shaped structure, a light efficiency in a −Z direction may be improved by a condensing effect of the convex lens-shaped structure.

In an embodiment, the first quantum dot layer 413, the second quantum dot layer 423, and the light-transmitting layer 433 may be provided in the first through-hole 410, the second through-hole 420, and the third through-hole 430 provided in the convex shape downward in the −Z direction, respectively.

Figure 34:
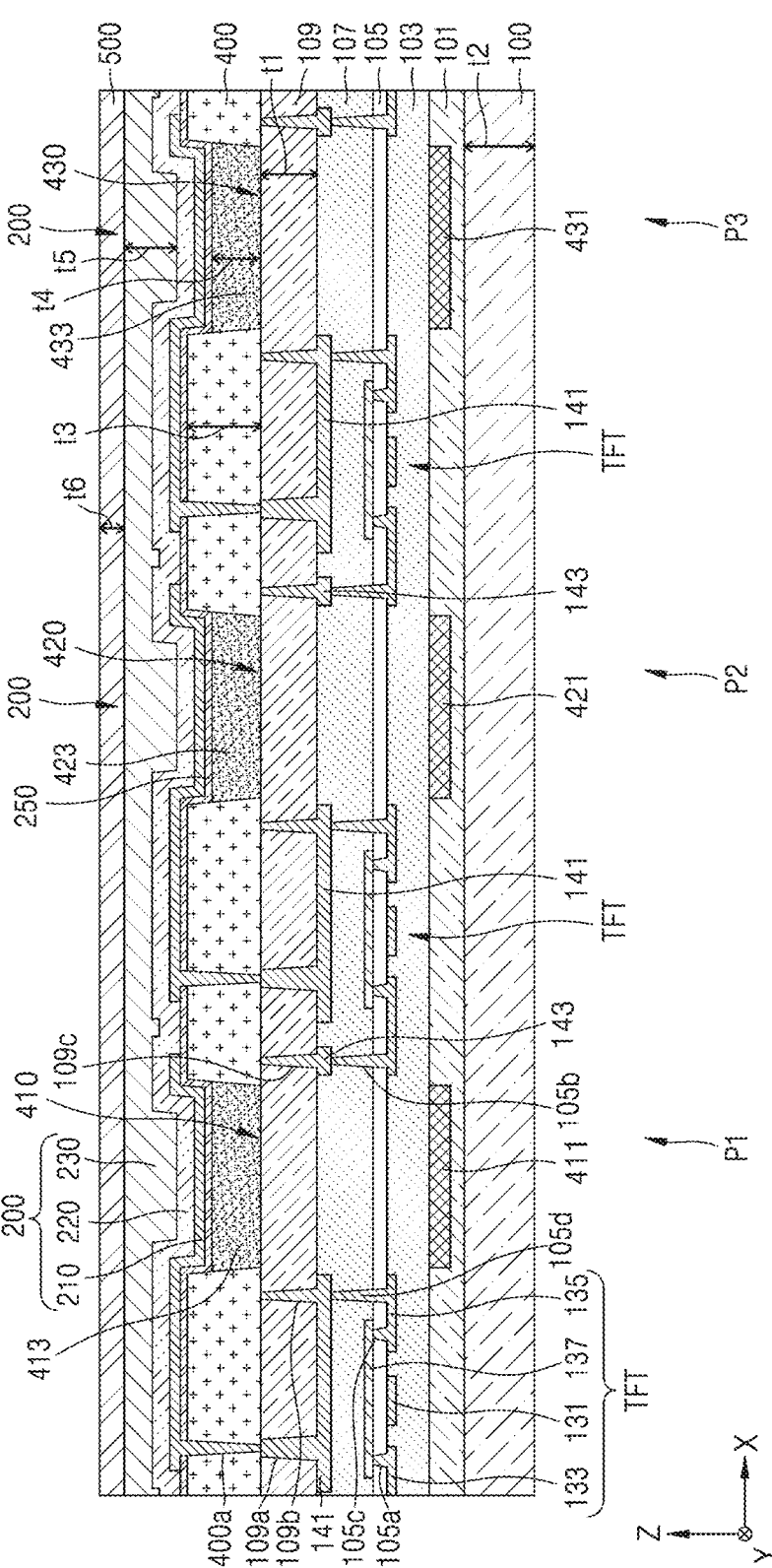
FIG. 34 is a cross-sectional view of a portion of a display apparatus according to still another embodiment.

FIG. 34 is a cross-sectional view of a portion of a display apparatus according to still another embodiment. The embodiment of FIG. 34 is different from the embodiment of FIG. 2 in that a protective layer 250 is arranged between the first quantum dot layer 413 and the pixel electrode 210, between the second quantum dot layer 423 and the pixel electrode 210, and between the light-transmitting layer 433 and the pixel electrode 210. In FIG. 34, the same reference numerals as in FIG. 2 refer to the same members, and redundant descriptions thereof will be omitted.

Referring to FIG. 34, in an embodiment, a protective layer 250 is respectively arranged between the first quantum dot layer 413 and the pixel electrode 210, between the second quantum dot layer 423 and the pixel electrode 210, and between the light-transmitting layer 433 and the pixel electrode 210. In an embodiment, the protective layers 250 respectively arranged between the first quantum dot layer 413 and the pixel electrode 210, between the second quantum dot layer 423 and the pixel electrode 210, and between the light-transmitting layer 433 and the pixel electrode 210 may serve to protect the first quantum dot layer 413, the second quantum dot layer 423, and the light-transmitting layer 433.

In an embodiment, the protective layer 250 may be formed as a single layer or multiple layers constituting a film including an organic material or an inorganic material. In an embodiment, the protective layer 250 may include a general polymer such as BCB, PI, HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. In an embodiment, the protective layer 250 may include $SiO_X$, $SiN_X$, $SiO_XN_Y$, $Al_2O_3$, $TiO_2$, $Ta_2O_5$, $HfO_2$, or ZnO.

In an embodiment, the protective layer 250 may not be arranged in the contact hole 400a defined in the second planarization layer 400. However, the disclosure is not limited thereto. For example, at least a portion of the protective layer 250 may also be arranged in the contact hole 400a defined in the second planarization layer 400. In this case, in order to facilitate contact between the connection electrode 141 and the pixel electrode 210, a width (or area) of the contact hole 400a defined in the second planarization layer 400 may be greater.

As described above, according to an embodiment, by forming a color filter layer and a quantum dot layer on a substrate on which a transistor is arranged, a display apparatus with improved light efficiency and a method of manufacturing the same may be realized. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
an overcoat layer;
a first planarization layer arranged on the overcoat layer;
a first color filter layer, a second color filter layer, and a third color filter layer, arranged disposed between the overcoat layer and the first planarization layer;
the first planarization layer arranged on the first color filter layer, the second color filter layer, and the third color filter layer;
a second planarization layer arranged on the first planarization layer and defining a first through-hole, a second through-hole, and a third through-hole therein;
a first quantum dot layer located in the first through-hole; and
a second quantum dot layer located in the second through-hole.

2. The display apparatus of claim 1, further comprising a light-transmitting layer located in the third through-hole.

3. The display apparatus of claim 2, wherein the first quantum dot layer at least partially overlaps the first color filter layer, the second quantum dot layer at least partially overlaps the second color filter layer, and the light-transmitting layer at least partially overlaps the third color filter layer in a plan view.

4. The display apparatus of claim 2, further comprising a light-emitting device arranged on the second planarization layer and including a light-emitting layer.

5. The display apparatus of claim 4, wherein the light-emitting device further comprises:
a pixel electrode; and
an opposite electrode corresponding to the pixel electrode,
wherein the light-emitting layer is arranged on the pixel electrode to be interposed between the pixel electrode and the opposite electrode.

6. The display apparatus of claim 5, wherein the pixel electrode is arranged directly on the first quantum dot layer.

7. The display apparatus of claim 5, further comprising a protective layer between the pixel electrode and the first quantum dot layer.

8. The display apparatus of claim 5, wherein the first quantum dot layer is between the first color filter layer and the light-emitting device.

9. The display apparatus of claim 8, further comprising a transistor between the first color filter layer and the first quantum dot layer.

10. The display apparatus of claim 9, wherein the transistor does not overlap the first color filter layer in a plan view.

11. The display apparatus of claim 9, further comprising a connection electrode on the transistor,
wherein the connection electrode electrically connects the transistor and the light-emitting device to each other.

12. The display apparatus of claim 11, further comprising a light-shielding electrode on the transistor.

13. The display apparatus of claim 1, wherein the second planarization layer has a maximum thickness of about 10 micrometers ($\mu$m) to about 15 $\mu$m.

14. The display apparatus of claim 13, wherein the first planarization layer has a maximum thickness of about 8 $\mu$m to about 13 $\mu$m.

15. The display apparatus of claim 1, wherein a bottom surface of each of the first through-hole, the second through-hole, and the third through-hole is convex in a direction toward the overcoat layer.

\* \* \* \* \*